(12) United States Patent
Sekine et al.

(10) Patent No.: US 10,615,201 B2
(45) Date of Patent: Apr. 7, 2020

(54) IMAGE SENSOR AND METHOD OF MANUFACTURING THE SAME

(71) Applicant: NLT Technologies, Ltd., Kanagawa (JP)

(72) Inventors: Hiroyuki Sekine, Kanagawa (JP); Takayuki Ishino, Kanagawa (JP); Yusuke Yamamoto, Kanagawa (JP); Yoshikazu Hatazawa, Kanagawa (JP); Fuminori Tamura, Kanagawa (JP)

(73) Assignee: TIANMA MICROELECTRONICS CO., LTD., Shenzhen (CN)

( * ) Notice: Subject to any disclaimer, the term of this patent is extended or adjusted under 35 U.S.C. 154(b) by 17 days.

(21) Appl. No.: 15/421,718

(22) Filed: Feb. 1, 2017

(65) Prior Publication Data

US 2017/0250214 A1 Aug. 31, 2017

(30) Foreign Application Priority Data

Feb. 26, 2016 (JP) .................................. 2016-036296

(51) Int. Cl.
*H01L 27/146* (2006.01)
*H01L 27/12* (2006.01)
(Continued)

(52) U.S. Cl.
CPC .... *H01L 27/14616* (2013.01); *H01L 27/1225* (2013.01); *H01L 27/1462* (2013.01);
(Continued)

(58) Field of Classification Search
CPC ........... H01L 27/14616; H01L 29/7869; H01L 29/78645; H01L 31/03762;
(Continued)

(56) References Cited

U.S. PATENT DOCUMENTS 5,981,931 A * 11/1999 Kinno ............... H01L 27/14658
250/208.1
2006/0108529 A1 5/2006 Saito et al.
(Continued)

FOREIGN PATENT DOCUMENTS

JP 04-206573 7/1992
JP 2006-165530 6/2006
(Continued)

OTHER PUBLICATIONS

Office Action issued in Japanese Patent Application No. 2016-036296 dated Feb. 4, 2020 with English translation provided.

*Primary Examiner* — Mouloucoulaye Inoussa
(74) *Attorney, Agent, or Firm* — Young & Thompson

(57) ABSTRACT

In manufacturing an image sensor for FPD having an oxide semiconductor TFT as a switching element, a large amount of hydrogen contained in raw gas is diffused in the oxide semiconductor at the time of forming a-Si photo diode (PD) which is a photoelectric conversion element, causing significant variation in the characteristic of TFT which may thereby not operate. In an image sensor in which an oxide semiconductor TFT and a-Si PD are formed on a substrate in this order, a gas barrier film is disposed between the oxide semiconductor TFT and the PD, and the drain terminal (drain metal) of the oxide semiconductor TFT is connected to one terminal (lower electrode) of the PD via connection wiring (bridge wiring) formed on a protective film arranged over the PD.

12 Claims, 25 Drawing Sheets

(51) Int. Cl.
*H01L 29/786* (2006.01)
*H01L 31/0203* (2014.01)
*H01L 31/0376* (2006.01)

(52) U.S. Cl.
CPC .. *H01L 27/14636* (2013.01); *H01L 27/14685* (2013.01); *H01L 27/14689* (2013.01); *H01L 27/14692* (2013.01); *H01L 29/7869* (2013.01); *H01L 29/78645* (2013.01); *H01L 31/0203* (2013.01); *H01L 31/03762* (2013.01); *H01L 29/78648* (2013.01)

(58) Field of Classification Search
CPC ........... H01L 27/14636; H01L 31/0203; H01L 27/14689; H01L 27/14685; H01L 27/14658; H01L 27/14623; H01L 27/14663; H01L 27/1462; H01L 27/14609; A61B 6/4233; A61B 6/4241; G01N 23/04
USPC ............. 250/208.1, 370.09; 257/59, E27.14, 257/E31.086; 438/59, 75
See application file for complete search history.

(56) References Cited

U.S. PATENT DOCUMENTS

| | | | |
|---|---|---|---|
| 2006/0227232 A1* | 10/2006 | Zhang | H01L 27/14634 348/294 |
| 2009/0194672 A1* | 8/2009 | Tredwell | H04N 3/1568 250/208.1 |
| 2010/0134735 A1 | 6/2010 | Nakamura et al. | |
| 2012/0153173 A1* | 6/2012 | Chang | H01L 27/14603 250/370.08 |
| 2013/0075732 A1 | 3/2013 | Saito et al. | |
| 2014/0102877 A1 | 4/2014 | Yamazaki | |
| 2015/0123119 A1 | 5/2015 | Sekine et al. | |
| 2016/0013243 A1 | 1/2016 | O'Rourke et al. | |
| 2016/0359114 A1 | 12/2016 | Nakamura | |

FOREIGN PATENT DOCUMENTS

| | | |
|---|---|---|
| JP | 2010-153834 A | 7/2010 |
| JP | 2013-102131 A | 5/2013 |
| JP | 2014-129590 A | 7/2014 |
| JP | 2015-090957 | 5/2015 |
| JP | 2015-170859 | 9/2015 |
| WO | 2015-133391 A1 | 4/2017 |

* cited by examiner

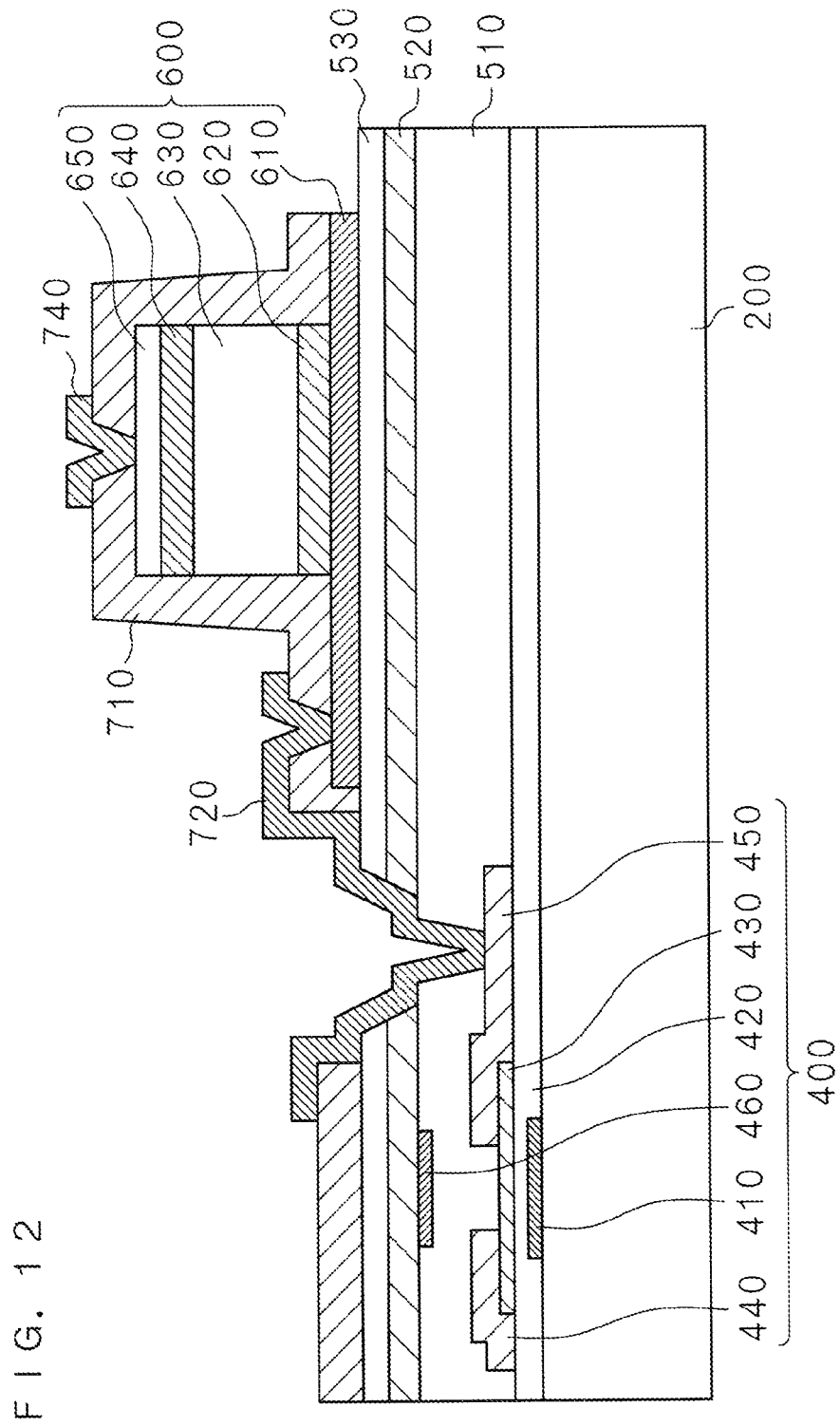

F I G. 1 3
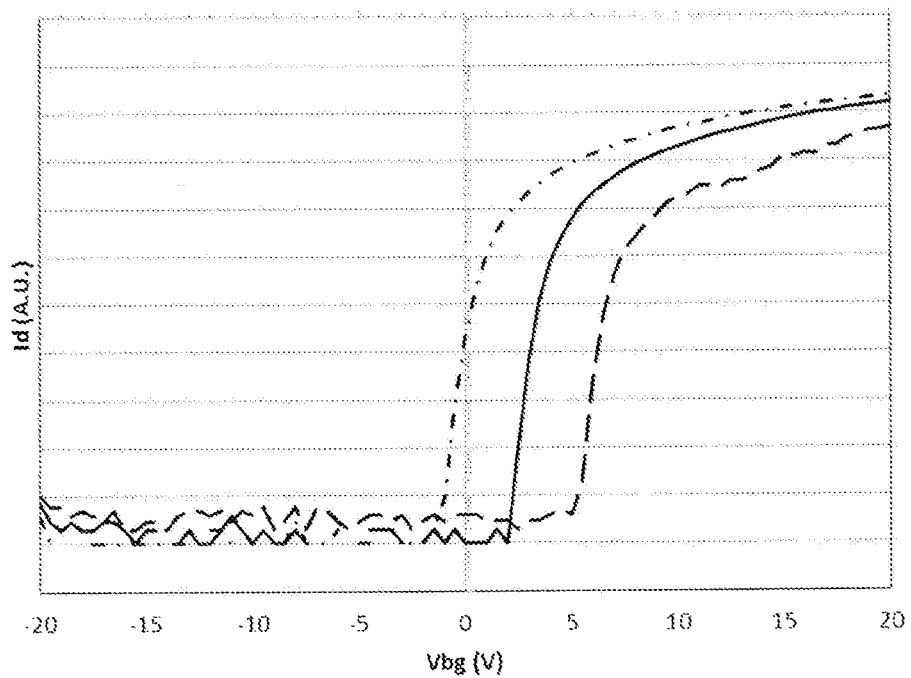

IMAGE SENSOR AND METHOD OF MANUFACTURING THE SAME

CROSS-REFERENCE TO RELATED APPLICATION

This non-provisional application claims priority under 35 U.S.C. § 119(a) on Patent Application No. 2016-036296 filed in Japan on Feb. 26, 2016, the entire contents of which are hereby incorporated by reference.

FIELD

The present invention relates to an image sensor, and to an image sensor having, for example, an oxide semiconductor as a switching element.

BACKGROUND

The technology of inspecting the inner part of a specimen using an X-ray transmission image in a non-destructive way has been essential in the field of medical and industrial non-destructive inspection. In particular, a flat panel detector (FPD) which directly captures an X-ray transmission image as electronic data has widely been used because of its rapid image taking, assistance for interpretation of radiogram by image processing, and so forth. As disclosed in Japanese Patent Application Laid-Open Publication No. H4-206573, an image sensor used in the FPD has a structure in which pixels at least including a photoelectric conversion element and a switching element are arranged in an array. In the X-ray image sensor which is currently most often used, a-Si photo diode (PD) is employed as a photoelectric conversion element and a-Si thin film transistor (TFT) is employed as a switching element.

In recent years, in the field of medical services, a means for carrying out highly precise X-ray fluoroscopy (means for obtaining an X-ray video image) has strongly been desired. This is because, in a catheter treatment, the position of the catheter needs to be accurately confirmed in real time. An image intensifier which is often used in X-ray fluoroscopy can only obtain insufficient spatial resolution in principle. Moreover, the current X-ray image sensor cannot easily operate at high speed. It is therefore difficult for the X-ray image sensor to carry out fluoroscopy at a high frame rate. The current X-ray image sensor is not capable of operating at high speed because the current-driving ability of the a-Si TFT which is a switching element is low. Meanwhile, as a means for making a switching element operate at high speed, Japanese Patent Application Laid-Open Publication No. 2006-165530 discloses a method of using an oxide semiconductor TFT as a switching element. The oxide semiconductor disclosed here includes, for example, an amorphous oxide containing In, Ga and Zn.

However, in the case where a TFT of an oxide semiconductor is used as a switching element in order to speed up the image sensor, such a problem occurs that the characteristic of the oxide semiconductor TFT is significantly varied at the time of manufacturing the image sensor. The inventors have analyzed the problem and found that the oxide semiconductor changes its property due to raw gas containing a large amount of hydrogen, which is used in forming a-Si PD, or due to the temperature in the process, and thereby varies the characteristic of the TFT.

To address this, the inventors have proposed in Japanese Laid-Open Publication No. 2015-90957 a structure in which a blocking layer for suppressing transmission of hydrogen is arranged between the oxide semiconductor TFT and the a-Si PD. A similar method is also disclosed in Japanese Patent Application Laid-Open Publication No. 2015-170859.

FIG. 25 is a section view illustrating the structure of an image sensor having an oxide semiconductor TFT in a related technology. An example disclosed in Japanese Patent Application Laid-Open Publication No. 2015-170859 will be described with reference to FIG. 25. In this example, a hydrogen barrier dielectric layer 37 is arranged on an oxide semiconductor TFT 11. A contact hole is formed in the hydrogen barrier dielectric layer 37. Through the contact hole, a source/drain layer 19 of the oxide semiconductor TFT 11 is electrically connected to a bottom diode contact 32 of a photosensitive element 31. Here, the bottom diode contact 32 is a metal layer containing Cr, Ti, W, Mo, Al, Nd-doped Al, Ta or a combination thereof. The hydrogen barrier dielectric layer 37 is a dielectric layer containing silicon nitride, silicon oxide, silicon oxide nitride, aluminum oxide, aluminum nitride, aluminum oxynitride, titanium oxide, tantalum oxide, titanium nitride, tantalum nitride, or a combination thereof. The bottom diode contact 32 and the hydrogen barrier dielectric layer 37 serve to prevent hydrogen at the time of forming the photosensitive element 31 from being diffused to the oxide semiconductor TFT 11.

SUMMARY

However, the inventors conducted a detailed experiment in relation to diffusion of hydrogen contained in the raw gas of a-Si PD to the oxide semiconductor and the associated variation in the characteristic of the oxide semiconductor TFT, and found that the structure disclosed in Japanese Patent Application Publication No. 2015-170859 cannot sufficiently suppress the variation in the characteristic of the oxide semiconductor TFT.

An image sensor according to an aspect of the present disclosure comprises a switching element including oxide semiconductor TFTs, a gas barrier film, a photoelectric conversion element including a photo diode having amorphous silicon, and a protective film are layered in this sequence on a substrate and further comprises a connection wiring arranged on the protective film covering the photoelectric conversion element and electrically connecting a drain electrode of the switching element to one terminal of the photoelectric conversion element via a contact hole.

The above and further objects and features will more fully be apparent from the following detailed description with accompanying drawings.

It is to be understood that both the foregoing general description and the following detailed description are exemplary and explanatory and are not restrictive of this disclosure.

BRIEF DESCRIPTION OF THE DRAWINGS

FIG. 12 is a section view illustrating the structure of an image sensor according to Embodiment 2;

FIG. 13 is a graph illustrating the result of evaluation for the characteristic of the oxide semiconductor TFT in the image sensor according to Embodiment 2 while the second gate voltage is changed;

DETAILED DESCRIPTION

Embodiment 1

Figure 1:
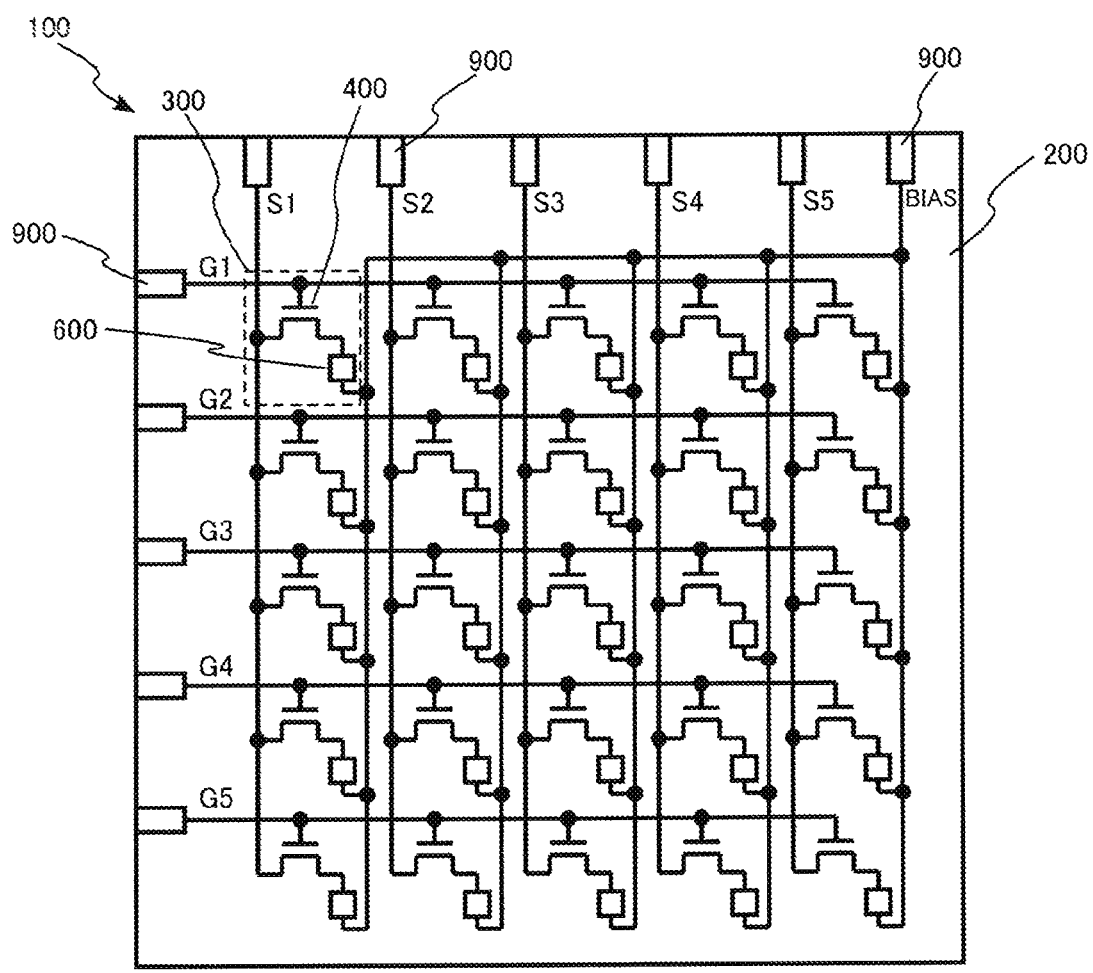
FIG. 1 is a circuit diagram illustrating the configuration of an image sensor according to Embodiment 1.

Embodiments of the present invention will be described below in detail with reference to the drawings. The size and scale of each component in the drawings are appropriately modified so as to ensure the visibility of the drawings. Moreover, hatched parts in the drawings are to distinguish components from each other, not necessarily indicating cut planes.

FIG. 1 is a circuit diagram illustrating the configuration of an image sensor 100 according to Embodiment 1. For the sake of simplicity, the pixel arrangement of five rows and five columns are illustrated here. The image sensor 100 includes signal lines (S1-S5) and gate lines (G1-G5) that are vertically and horizontally arranged on a substrate 200. The image sensor 100 includes pixels 300 that are divided by the signal lines (S1-S5) and the gate lines (G1-G5). The pixels 300 are arranged in matrix. In each pixel, a TFT 400 which is a switching element and a PD 600 which is a photoelectric conversion element are at least arranged. The gate terminal of the TFT 400 is connected to a common gate line for each pixel row. The source terminal is connected to a common signal line for each pixel column. The drain terminal of the TFT 400 is connected to one terminal of the PD 600. The other terminal of the PD 600 is connected to a BIAS wiring (BIAS) shared by all pixels. The signal line, gate line and BIAS wiring are connected to an external circuit via a terminal 900 located at an end of the substrate 200.

Figure 2:
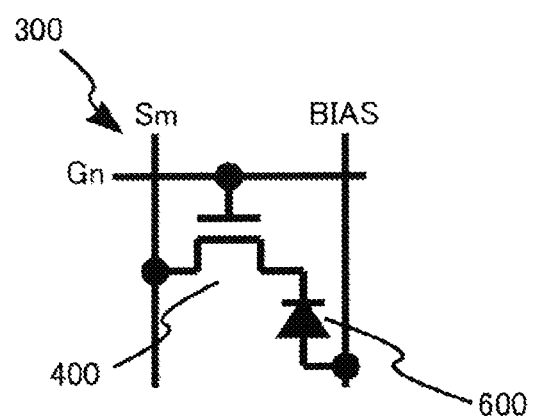
FIG. 2 is a circuit diagram illustrating the circuit configuration of one pixel in the image sensor according to Embodiment 1.

FIG. 2 is a circuit diagram illustrating the circuit configuration of one pixel in the image sensor 100 according to Embodiment 1. In the illustrated example, the drain terminal of the TFT 400 is connected to the cathode terminal of the PD 600. The anode terminal of the PD 600 is connected to the BIAS wiring.

Figure 3:
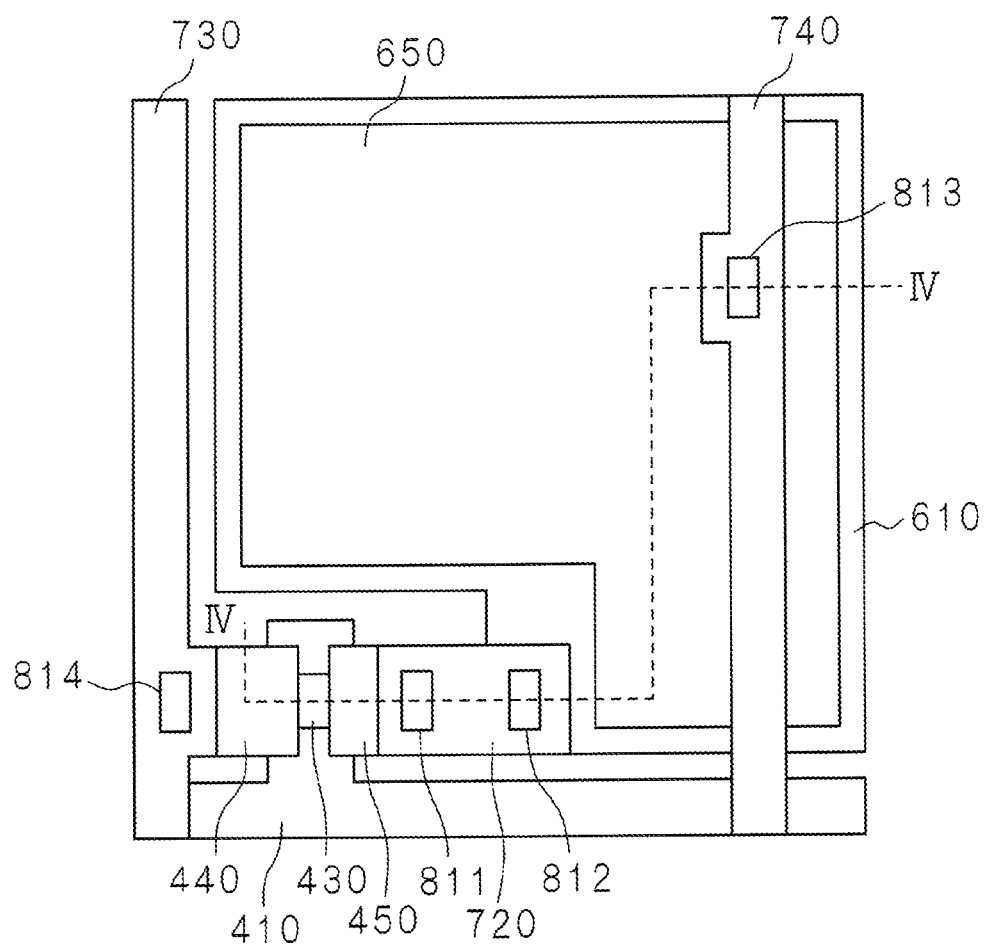
FIG. 3 is a layout of one pixel in the image sensor according to Embodiment 1.

FIG. 3 is a layout of one pixel in the image sensor 100 according to Embodiment 1. An example with an inverse staggered TFT is illustrated here. In the drawing, the pattern of gate metal forming the gate and gate wiring of the TFT is denoted by 410. A semiconductor layer in the TFT is denoted by 430, while the pattern of source/drain metal forming the source terminal of the TFT is denoted by 440. The pattern of source/drain metal forming the drain terminal of the TFT is denoted by 450. The pattern of lower electrode metal of the PD 600 is denoted by 610. The pattern of upper metal of the PD 600 is denoted by 650. In the present example, the lower electrode 610 serves as the cathode terminal of the PD 600. The upper electrode 650 serves as an anode terminal. The pattern of metal forming bridge wiring is denoted by 720. The pattern of metal forming a signal line is denoted by 730. The bridge wiring 720 electrically connects the drain terminal of the TFT to the lower electrode 610 of the PD 600. The pattern of metal forming the BIAS wiring is denoted by 740. In this example, the bridge wiring, BIAS wiring and signal line are formed in the same metal layer. Contact holes for electrically connecting the bridge wiring, BIAS wiring and signal line to other metal layers are denoted by 811, 812, 813 and 814.

Figure 4:
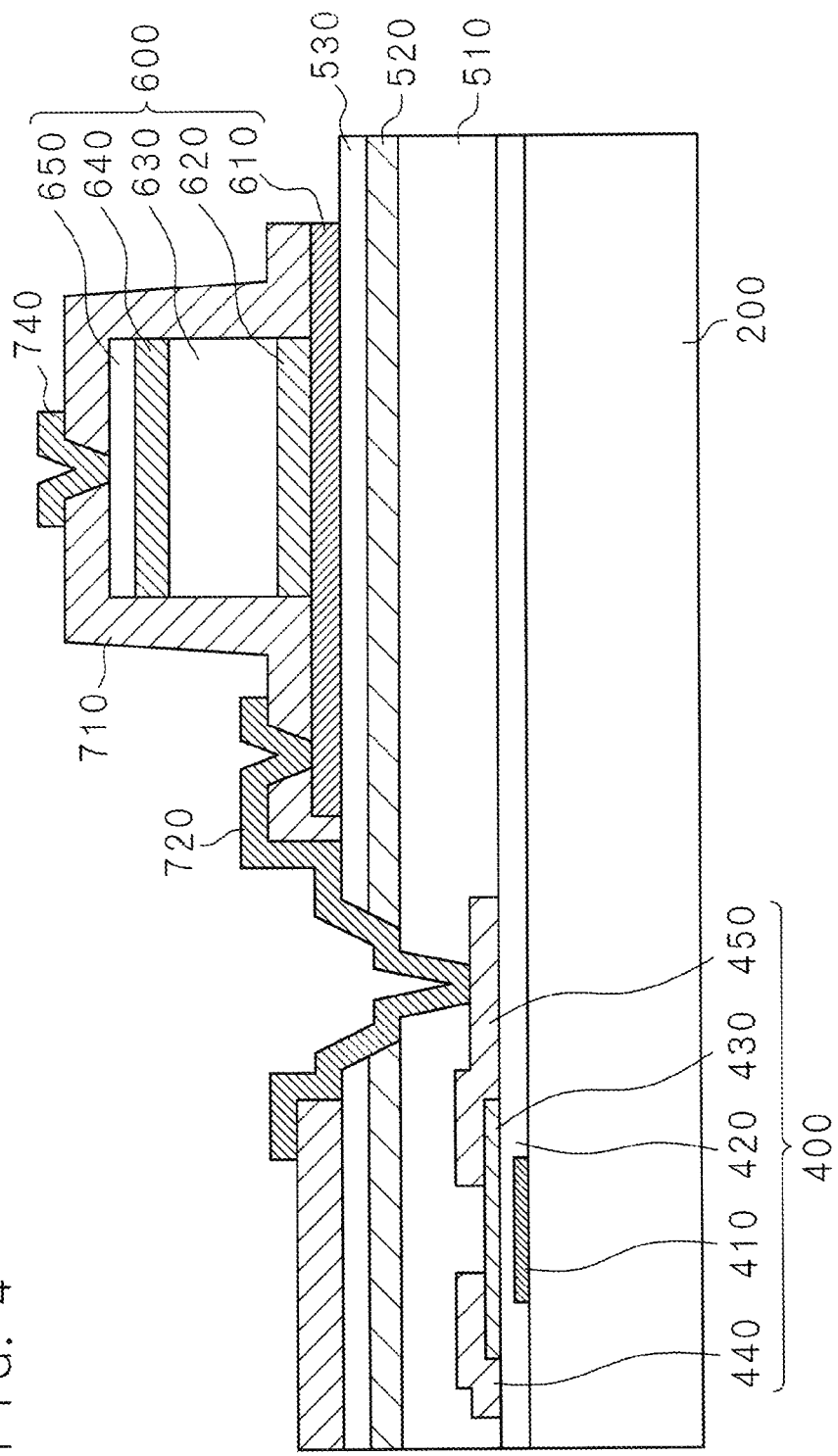
FIG. 4 is a section view illustrating the structure of the image sensor according to Embodiment 1.

FIG. 4 is a section view (section along the IV-IV line indicated in FIG. 3) illustrating the structure of the image sensor 100 according to Embodiment 1. The image sensor 100 according to Embodiment 1 of the present invention includes, on the substrate 200, the TFT 400 and the PD 600, as well as a first interlayer film 510, a gas barrier film 520 and a second interlayer film 530. The TFT 400 is constituted by metal forming a gate 410, a gate insulating film 420, a semiconductor layer 430 and source/drain metal 440, 450. The PD 600 is constituted by a lower electrode 610, n-a-Si:H (n-type hydrogenated amorphous silicon) 620, i-a-Si:H (intrinsic hydrogenated amorphous silicon) 630, p-a-Si:H (p-type hydrogenated amorphous silicon) 640, and an upper electrode 650. The first interlayer film 510, the gas barrier film 520 and the second interlayer film 530 are arranged between the TFT 400 and the PD 600. A protective film 710 is layered to cover the upper part and side walls of the PD 600. On the protective film 710, the signal line 730, BIAS wiring 740 and bridge wiring 720 are formed. The signal line 730, BIAS wiring 740 and bridge wiring 720 are made of metal. The drain metal 450 of the TFT 400 is electrically connected to the lower electrode 610 of the PD 600 by the bridge wiring 720. The drain metal 450 is electrically connected to the bridge wiring 720 via the first contact hole. The first contact hole is formed in the first interlayer film 510, the gas barrier film 520, the second interlayer film 530 and the protective film 710. Moreover, the lower electrode 610 is electrically connected to the bridge wiring 720 via the second contact hole. The second contact hole is formed in the protective film 710. A part of the bridge wiring 720 is formed on the protective film 710.

As illustrated in FIG. 4, the opening area of a through hole concerning the first contact hole formed in the protective film 710 is equal to or larger than the opening area of the through hole concerning the first contact hole formed in the gas barrier film 520. As will be described later, since the first contact hole is opened after the protective film 710 covering the PD 600 is formed, it is necessary for the first contact hole to generally have a cross section of a vertical shape, forward tapered shape or stepped shape. That is, the opening area of the through hole in the protective film 710 at this portion is equal to or larger than the opening area of the through hole in the gas barrier film. This can prevent step disconnection in forming the bridge wiring 720 after forming the first contact hole.

Furthermore, as illustrated in FIG. 4, in the first contact hole, a part of the bridge wiring 720 is in direct contact with the inner surface of the through hole of the gas barrier film 520. Therefore, the through hole in the gas barrier film 520 is not in contact with the protective film 710. This is because the first contact hole is opened after the protective film 710 is formed, as in the above case.

The image sensor 100 according to Embodiment 1 comprises a switching element including oxide semiconductor TFTs that are layered in sequence on a substrate. The switching element is, for example, a TFT 400. At the upper side of the TFT 400, a gas barrier film 520 is layered. At the upper side of the gas barrier film 520, a photoelectric conversion element including a photo diode having amorphous silicon is layered. The photoelectric conversion element is, for example, the PD 600. Over the upper surface of the PD 600, a protective film 710 is layered. Moreover, the image sensor 100 is arranged over the protective film 710 covering the PD 600, and includes a connection wiring which electrically connects the drain electrode of the TFT 400 to one terminal of the PD 600 via contact holes. The contact holes are, for example, the first contact hole and the second contact hole. The connection wiring is, for example, the bridge wiring 720. One terminal of the PD 600 is, for example, the lower electrode 610.

The image sensor 100 according to Embodiment 1 may employ an insulating substrate such as glass, as the substrate 200. For the semiconductor layer 430 forming the TFT 400 which is a switching element, an oxide semiconductor may be employed. The oxide semiconductor contains, for example, In, Ga and Zn. Preferably, the film thickness of i-a-Si:H 630 forming the PD 600 is approximately 1 μm in order to enhance the quantum efficiency.

In the image sensor 100 according to Embodiment 1, contact holes are formed in the first interlayer film 510, gas barrier film 520 and second interlayer film 530 after the PD 600 is deposited and formed, and the protective film 710 is deposited thereon. The gas barrier film 520 is, for example, an organic insulating film. For the gas barrier film 520, an insulating film of, for example, xylene polymer such as p-xylene polymer and m-xylene polymer, a derivative thereof, acrylic resin or epoxy resin may be employed. The thickness of the gas barrier film 520 is preferably equal to or larger than 1 μm.

Moreover, though not illustrated, a scintillator for converting X-rays into visible light is arranged over the signal line 730, bridge wiring 720 and BIAS wiring 740. Below the scintillator, a planarization film for the purpose of protecting elements and planarizing surfaces may also be formed.

The image sensor 100 according to Embodiment 1 is capable of carrying out highly precise X-ray fluoroscopy at a high frame. The reason therefor will be described below.

An FPD may be used in place of I.I. in order to obtain a highly precise X-ray transmission image. However, the image sensor used in the FPD in a related technology has employed a-Si TFT as a switching element. It is therefore difficult for the image sensor to operate at a high frame rate. If an oxide semiconductor is used for a TFT in order to obtain a high frame rate, the characteristic of the oxide semiconductor TFT may vary at the time of forming the a-Si PD. The variation in the characteristic of the TFT may cause the image sensor to operate abnormally. In the image sensor according to Embodiment 1, a gas barrier film is disposed between the oxide semiconductor TFT and the PD. Accordingly, even if a-Si is used for the PD, the variation in the characteristic of TFT may be suppressed. It is thus possible for the image sensor to operate at a high frame rate.

Figure 5:
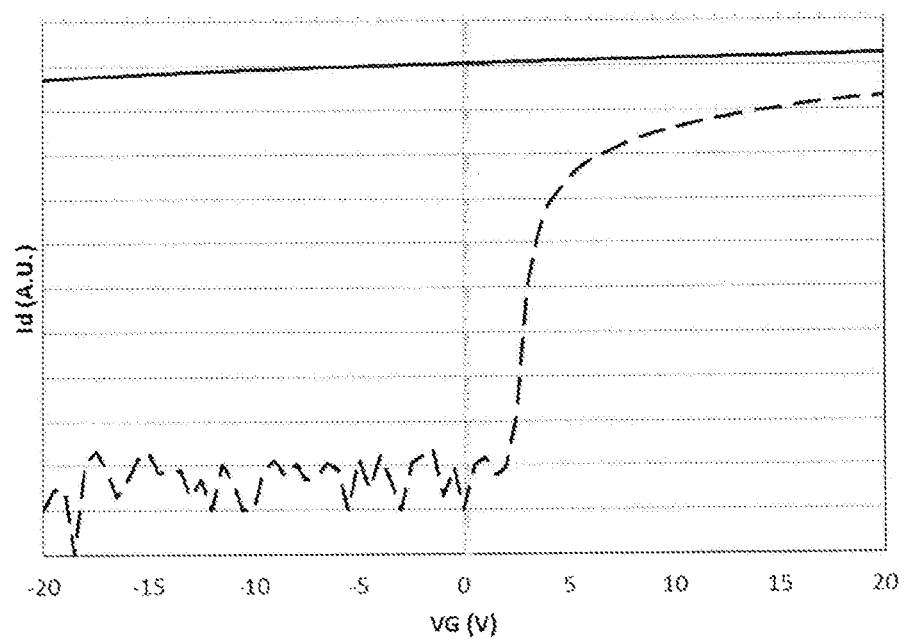
FIG. 5 is a graph illustrating the characteristics of the oxide semiconductor TFT in the structure without a gas barrier film, when compared between before and after the a-Si PD is formed.

FIG. 5 is a graph illustrating the characteristics of the oxide semiconductor TFT in the structure without a gas barrier film, when compared between before and after the a-Si PD is formed. The horizontal axis indicates gate voltage. The horizontal axis employs the unit of volt (V). The vertical axis indicates drain current. The vertical axis employs an arbitrary unit (a.u.). The dot line shows the Id-Vg characteristic (gate voltage dependency of drain current) of the oxide semiconductor TFT before the a-Si PD is formed. The solid line shows the Id-Vg characteristic of the oxide semiconductor TFT after the a-Si PD is formed. After the a-Si PD is formed, the threshold voltage of the oxide semiconductor TFT significantly varies, while the TFT does not show any ON/OFF operation.

Figure 6:
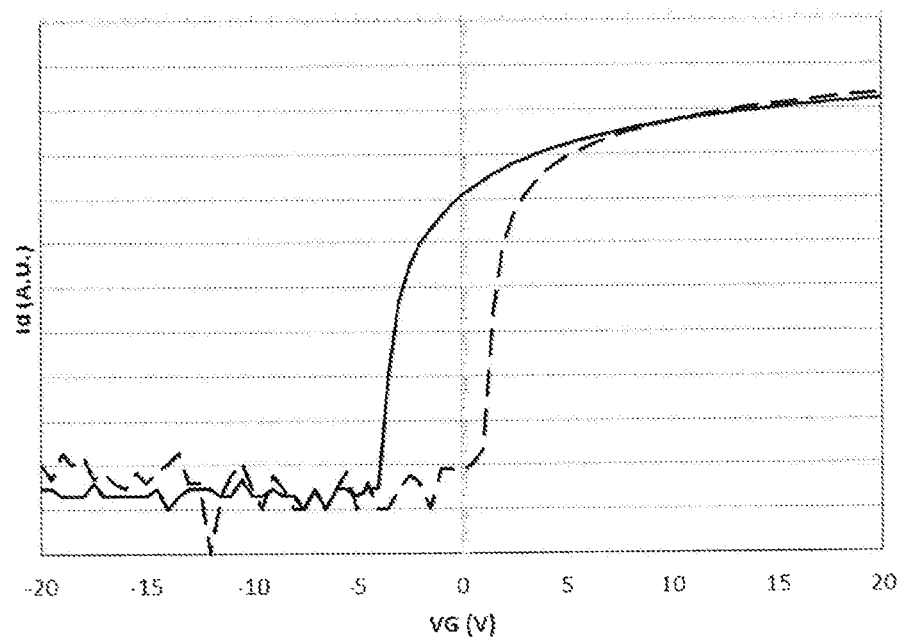
FIG. 6 is a graph illustrating the characteristics of the oxide semiconductor TFT in the image sensor according to Embodiment 1, when compared between before and after the a-Si PD is formed

FIG. 6 is a graph illustrating the characteristics of the oxide semiconductor TFT in the image sensor according to Embodiment 1, when compared between before and after the a-Si PD is formed. The horizontal axis indicates gate voltage. The horizontal axis employs the unit of volt (V). The vertical axis indicates drain current. The vertical axis employs an arbitrary unit (a.u.). The dot line shows the Id-Vg characteristic before the a-Si PD is formed. The solid line shows the characteristic after the formation. Here, p-xylene polymer is used as a gas barrier film. As can be clearly seen from the drawing, in the structure of the image sensor, deterioration in the characteristic of the oxide semiconductor TFT is significantly suppressed even if the oxide semiconductor TFT is used as a switching element and the a-Si PD is used as a photoelectric conversion element.

Figure 7:
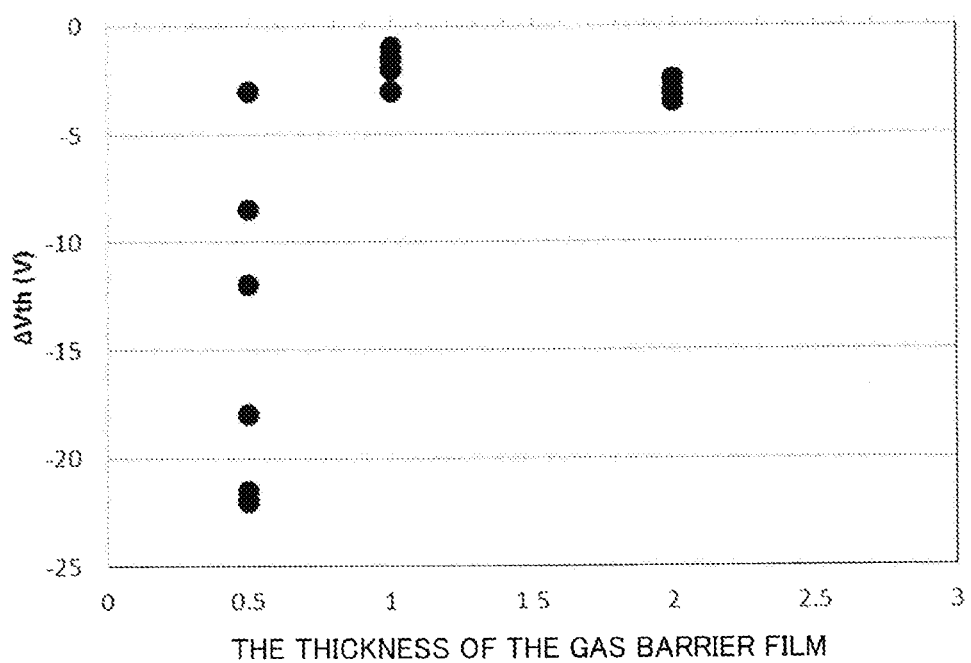
FIG. 7 is a graph illustrating the result of evaluation for the variation in the threshold voltage of the oxide semiconductor TFT under the hydrogen plasma environment with different thickness of the gas barrier film.

FIG. 7 is a graph illustrating the result of evaluation for the variation in the threshold voltage of the oxide semiconductor TFT under the hydrogen plasma environment with different thickness of the gas barrier film. The evaluation shows the result obtained by measurement of the TFT characteristic before and after the oxide semiconductor TFT with the gas barrier film is exposed to hydrogen plasma which is so produced as to have a condition equal to that for the deposition of the a-Si:H thin film. The horizontal axis in the graph of FIG. 7 indicates the thickness of the gas barrier film. The horizontal axis employs the unit of μm. As the gas barrier film, p-xylene polymer is used. The vertical axis indicates the variation in the TFT threshold voltage before and after a sample is exposed to hydrogen plasma. The vertical axis employs the unit of volt (V). As can be clearly seen from the drawing, a change in the characteristic of TFT may significantly be suppressed if the film thickness is equal to or larger than 1 µm.

Figure 8:
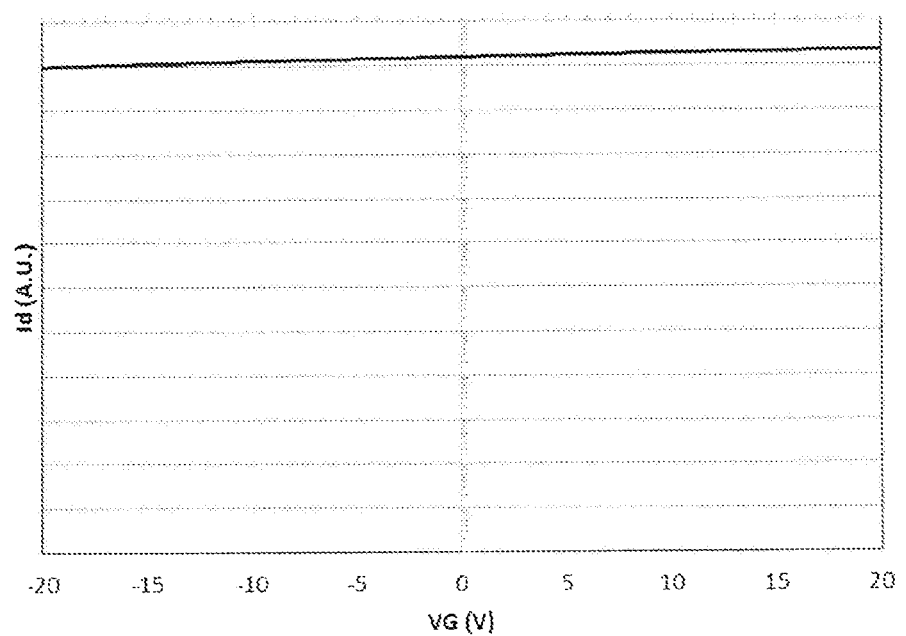
FIG. 8 is a graph illustrating the result of evaluation, performed after the a-Si PD is formed, for the characteristic of the oxide semiconductor TFT in the case where metal is used as the gas barrier film.

Moreover, for the purpose of confirming whether metal may be used as the gas barrier film, similar evaluation was carried out using Cr and ITO. FIG. 8 is a graph illustrating the result of evaluation, performed after the a-Si PD is formed, for the characteristic of the oxide semiconductor TFT in the case where metal is used as the gas barrier film. The horizontal axis indicates gate voltage. The horizontal axis employs the unit of volt (V). The vertical axis indicates drain current. The vertical axis employs an arbitrary unit (a.u.). The graph here illustrates the Id-Vg characteristic of the oxide semiconductor TFT after being left under the hydrogen plasma environment in the case where Cr with the thickness of 50 nm is used as the gas barrier film. As such, the threshold voltage significantly varies while the TFT does not show any ON/OFF operation. The experiment using ITO as the gas barrier film produced a similar result. If the film thickness of Cr which is the gas barrier film is largely increased, an effect of suppression may be obtained. If the metal layer is increased in its film thickness, stress is generated from the difference in the coefficient of thermal expansion between the metal layer and a glass substrate or the insulating film such as SiOx (silicon oxide), which may possibly cause the film to be peeled off. It is therefore not appropriate to use metal as the gas barrier film. The inventors have made considerations based on the experimental results indicated above and reached the conclusion as described below.

In a highly precise FPD, it is desirable for the thickness of the i-a-Si:H layer of the a-Si PD to be approximately 1 µm in order to ensure a sufficient. SN ratio. However, a long period of deposition time is required in order to fully deposit the i-a-Si:H layer with the film thickness of 1 µm. It is also required to introduce a large amount of hydrogen into the raw gas in order to reduce the dangling bond in the a-Si layer. Under such an environment, hydrogen may be diffused in the oxide semiconductor layer while the a-Si:H layer is deposited.

In the image sensor according to Embodiment 1, however, a gas barrier film 520 is disposed between the oxide semiconductor TFT 400 and the PD 600, and a contact hole or the like is not formed in the gas barrier film 520 until the PD 600 is completely formed. It is thus possible for the gas barrier film 520 to significantly suppress the diffusion of hydrogen. Furthermore, since no contact hole is formed in the gas barrier film 520 during deposition of the a-Si:H, the effect of suppressing the diffusion of hydrogen may be uniformly obtained over the entire region of the substrate. Accordingly, a change in quality of the oxide semiconductor may be prevented even if a thick film of a-Si:H is deposited, making it possible to suppress variation in the characteristic of the TFT 400. Thus, metal is not suitable for the gas barrier film 520, whereas an insulating film on which a sufficiently thick film may be deposited is suitable. In particular, xylene polymer such as p-xylene polymer and m-xylene polymer, its derivative, acrylic resin or epoxy resin is suitable.

Embodiment 2

Figure 9:
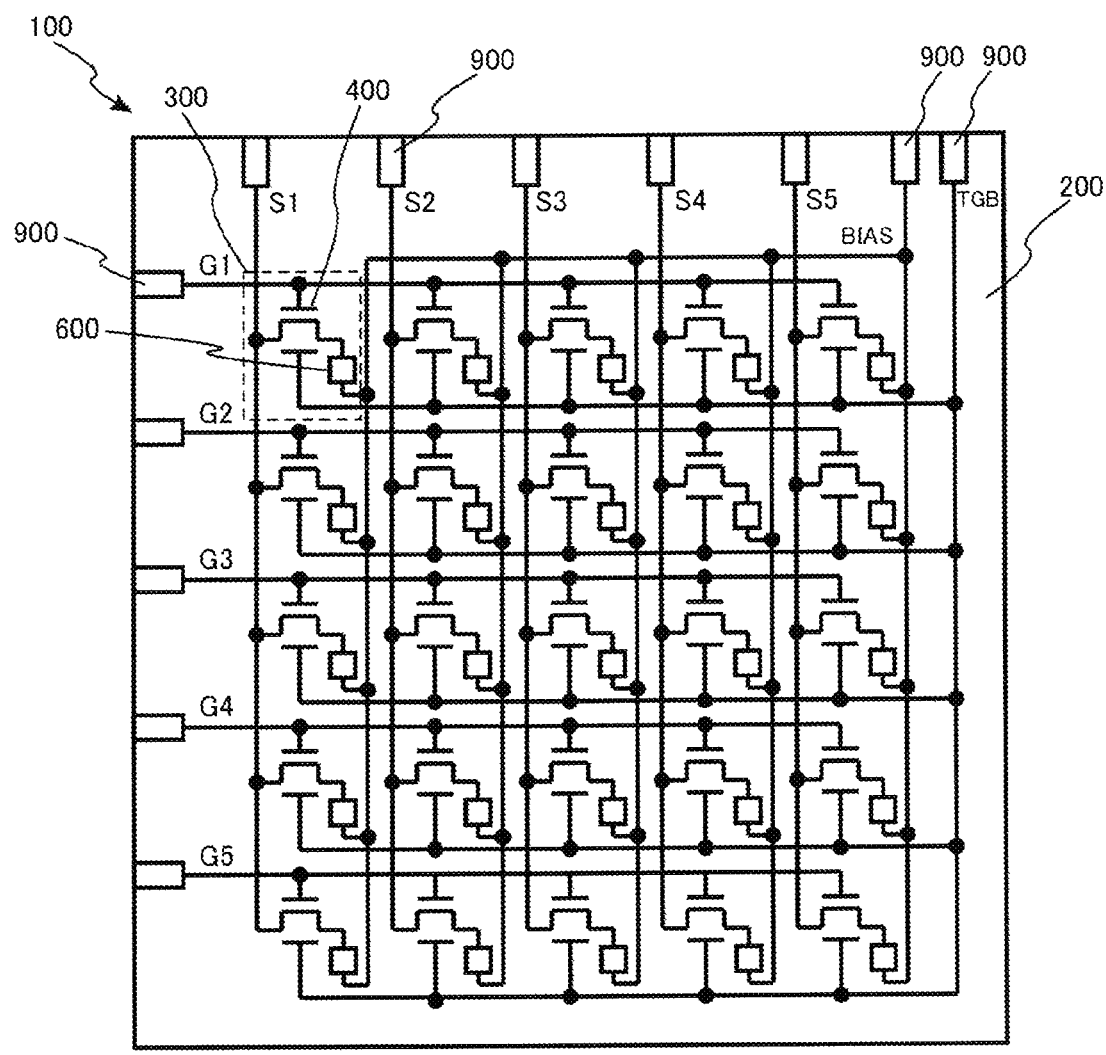
FIG. 9 is a circuit diagram illustrating the configuration of an image sensor according to Embodiment. 2.

FIG. 9 is a circuit diagram illustrating the configuration of an image sensor 100 according to Embodiment 2. Embodiment 2 is different from Embodiment 1 in that a dual gate structure TFT in which two gate electrodes with an insulating film interposed between them are arranged above and below the semiconductor layer 430 is employed as the TFT 400 which is a switching element. The TFT includes the first gate and the second gate. The first gate is connected to the gate line (G1-G5). The second gate is connected to the TGB wiring (TGB). The TGB wiring is shared by all pixels in the image sensor 100. The TGB wiring is connected to an external circuit via a terminal 900.

Figure 10:
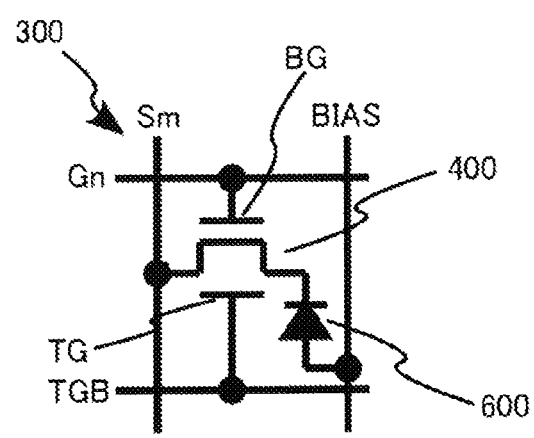
FIG. 10 is a circuit diagram illustrating the circuit configuration of one pixel in the image sensor according to Embodiment 2.

FIG. 10 is a circuit diagram illustrating the circuit configuration of one pixel in the image sensor 100 according to Embodiment 2. As described earlier, the image sensor 100 according to Embodiment 2 has the same circuit configuration of each pixel as in the image sensor 100 according to Embodiment 1, except that the second gate of the TFT 400 is connected to the TGB wiring. Here, an example where an inverse staggered dual gate structure is used as the TFT 400 is illustrated. The first gate is represented by BG in FIG. 10 whereas the second gate is represented by TG in FIG. 10.

Figure 11:
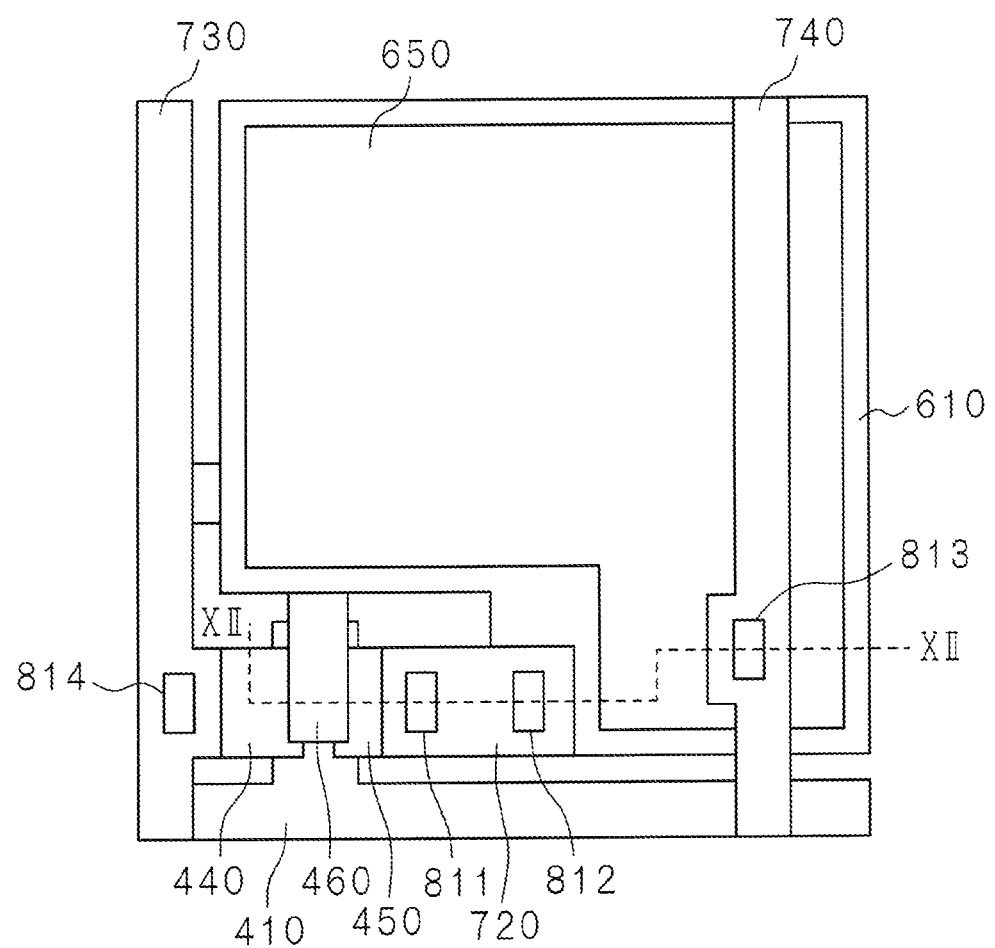
FIG. 11 is a layout of one pixel in the image sensor according to Embodiment 2.

FIG. 11 is a layout of one pixel in the image sensor 100 according to Embodiment 2. FIG. 12 is a section view (cross section along the XII-XII line in FIG. 11) illustrating the structure of an image sensor 100 according to Embodiment 2. The image sensor 100 according to Embodiment 2 is different from the image sensor 100 according to Embodiment 1 in that metal forming the second gate 460 is disposed between the gas barrier film 520 and the first interlayer film 510.

In the image sensor 100 according to Embodiment 2, voltage different from the voltage applied to the first gate is applied to the second gate 460 of the TFT 400. For example, common DC voltage is applied to the TFTs 400 in all pixels.

The image sensor 100 according to Embodiment 2 is capable of carrying out highly precise X-ray fluoroscopy at a high frame rate, as in the image sensor 100 according to Embodiment 1. In addition thereto, the yield of the image sensor may also be improved. It is further possible to enhance the reliability. The reason therefor will be described below.

The reason for the image sensor 100 according to Embodiment 2 being capable of carrying out highly precise X-ray fluoroscopy at a high frame rate is similar to the reason for the image sensor 100 according to Embodiment 1.

The yield may be improved in the image sensor 100 according to Embodiment 2 because the threshold voltage of the TFT 400 may be controlled by applying voltage to the second gate 460. As illustrated in FIG. 6, in the image sensor 100 according to Embodiment 1, the gas barrier film 520 is employed so that the variation in the threshold voltage of the oxide semiconductor TFT 400 may significantly be suppressed. However, as can be clearly seen from FIG. 6, the variation in the threshold voltage of the oxide semiconductor TFT 400 cannot be fully suppressed before and after the a-Si PD is formed. The threshold voltage of the TFT 400 varies also during the procedure of the manufacturing process other than the formation of the a-Si PD 600 due to various factors. The total value of such variations may possibly cause the characteristic of the TFT 400 in the finally-completed image sensor 100 to be out of the drive voltage range of the image sensor 100. FIG. 13 is a graph illustrating the result of evaluation for the characteristic of the oxide semiconductor TFT 400 in the image sensor 100 according to Embodiment 2 while the second gate voltage is changed. The horizontal axis indicates the first gate voltage. The horizontal axis employs the unit of volt (V). The vertical axis indicates drain current. The vertical axis employs an arbitrary unit (a.u.). The dashed-dotted line shows the characteristic in the case where +5V is applied to the second gate 460. The solid and broken lines respectively show the characteristics in the case where 0V and −5V are applied to the second gate 460. As can be clearly seen from the drawing, the threshold voltage of the TFT 400 may be controlled by changing the voltage to be applied to the second gate 460. Accordingly, in the image sensor 100 according to Embodiment 2, even if variation in the threshold voltage of the TFT 400 occurs to the extent beyond expectation during the procedure of the manufacturing process, the threshold voltage of the TFT 400 may be controlled by adjusting the voltage to be applied to the second gate electrode. This allows the TFT 400 to operate at appropriate drive voltage. Hence, the yield of the image sensor 100 is improved.

To supplement the description, the drive voltage range here means the voltage amplitude of a pulse waveform which is applied to the first gate of the TFT 400. The voltage of the amplitude is preferably as small as possible. If the pulse waveform is applied to the first gate of the TFT 400, charge noise is generated at the PD 600 and the signal line depending on the amplitude of the voltage. This is because the first gate and the gate wiring are electrically connected to the PD 600 or signal line via parasitic capacitance. It is particularly difficult for the charge noise applied to the signal line to be separated from the signal charge of the PD 600. The charge noise deteriorates the S/N ratio of the image sensor 100. It is thus desirable to set the drive voltage range as small as possible. In the image sensor 100 according to Embodiment 2, the threshold voltage of the TFT 400 may be adjusted after fabrication of the image sensor 100, which contribute to a small value setting of the drive voltage range and also to an increased S/N ratio.

Moreover, if the image sensor is used for a long period of time, the threshold voltage of the TFT varies due to electrical stress or the like. In the image sensor 100 according to the present invention, however, the voltage to be applied to the second gate 460 may be so adjusted that the variation in the threshold voltage of the TFT 400 may be canceled. Therefore, the reliability is enhanced.

The image sensor 100 includes two gate electrodes arranged separately from each other in the layering direction. The two gate electrodes are, for example, an electrode constituting the first gate and an electrode constituting the second gate 460.

Example 1

Figure 14:
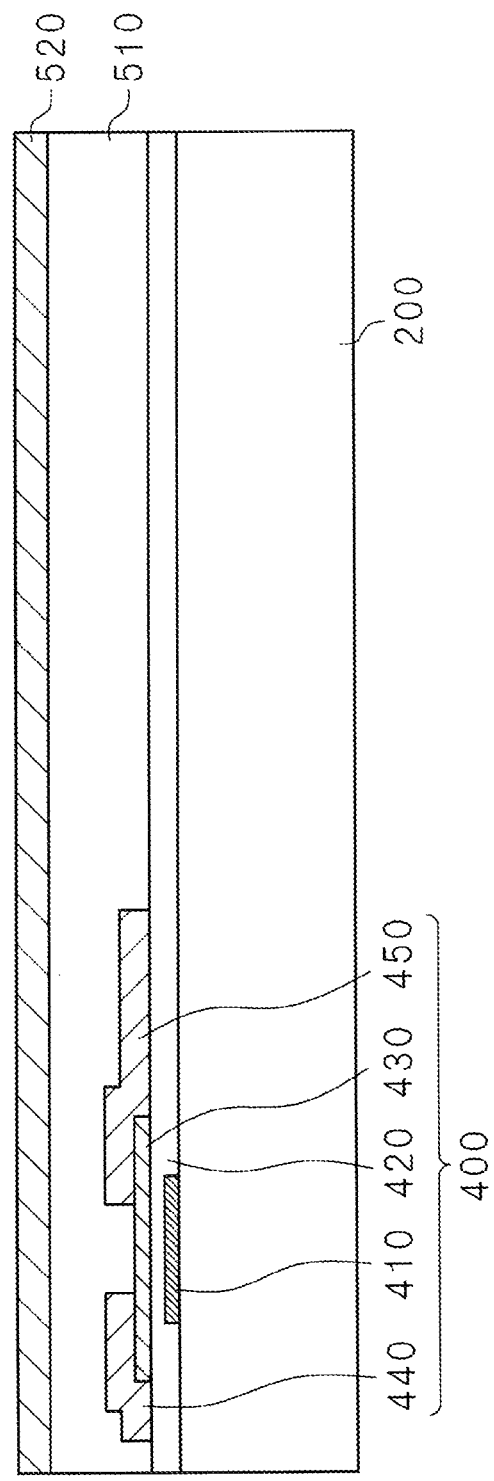
FIG. 14 is a section view illustrating the manufacturing process of the image sensor according to Example 1.
Figure 20:
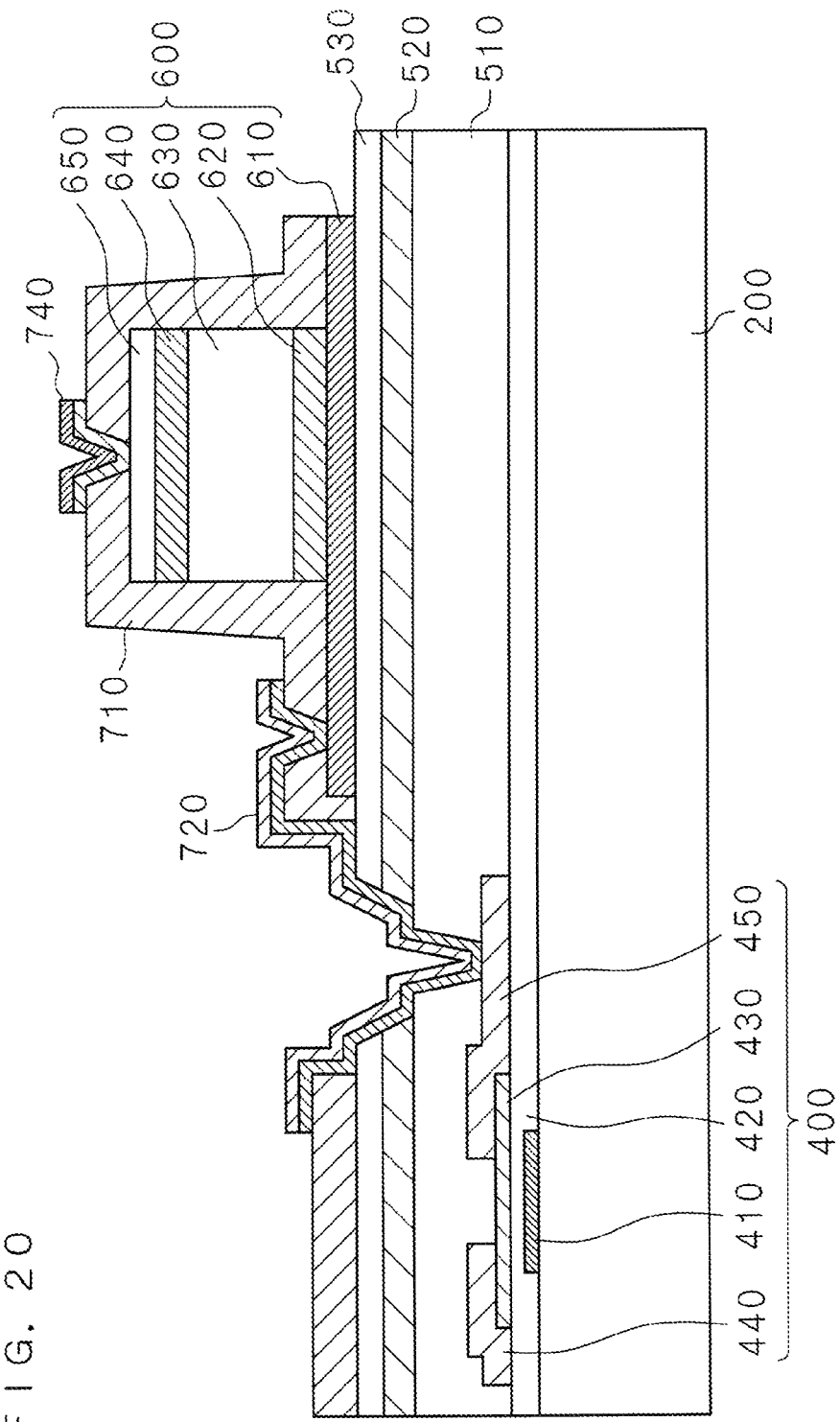
FIG. 20 is a section view illustrating the structure of the image sensor according to Example 1.
Figure 21:
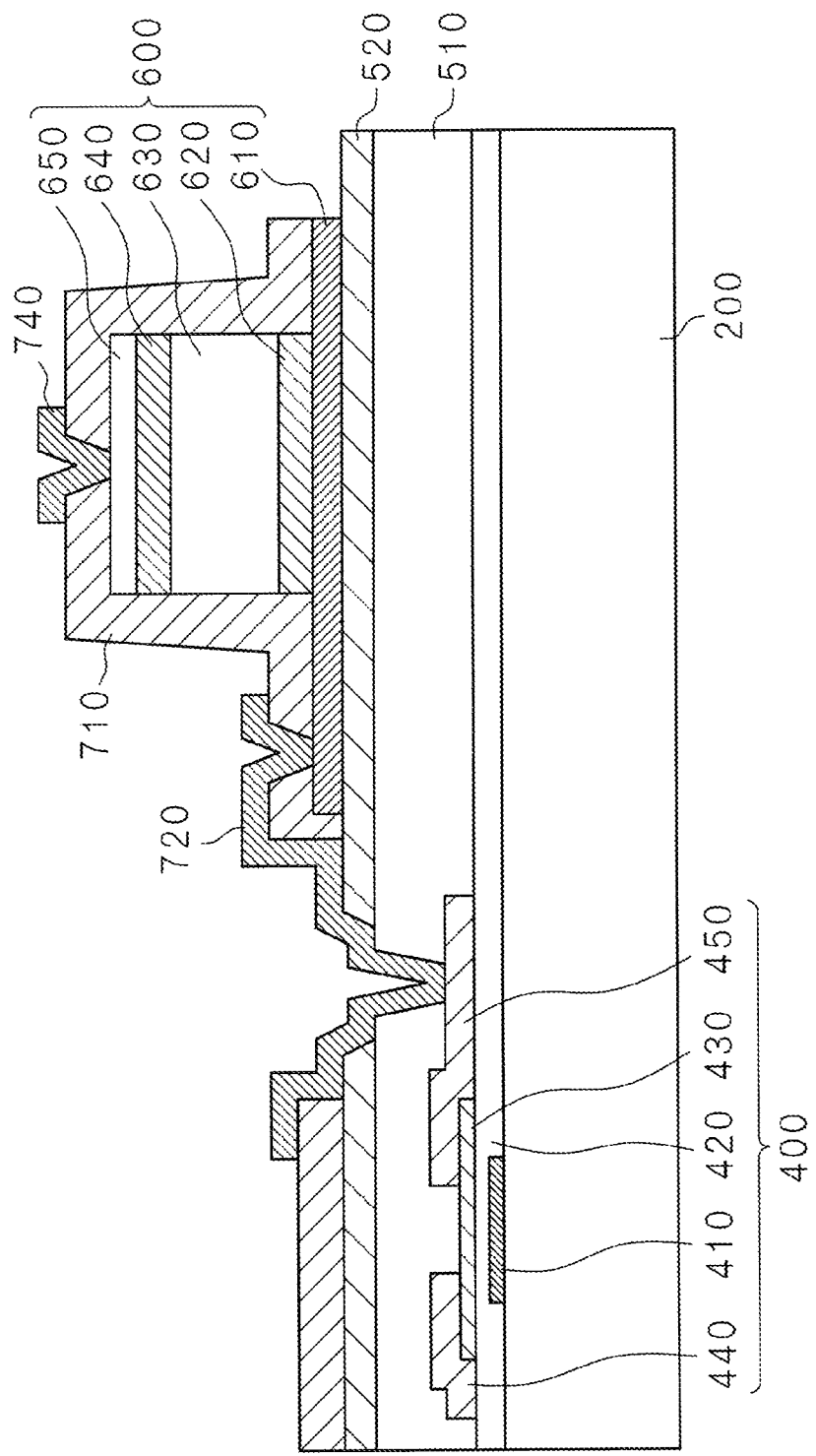
FIG. 21 is a section view illustrating the structure of the image sensor according to Example 1.

An example of the method of manufacturing the image sensor 100 according to Embodiment 1 will now be described. FIGS. 14 to 19 are section views illustrating the manufacturing process of the image sensor 100 according to Example 1. FIGS. 20 and 21 are section views illustrating the structure of the image sensor 100 according to Example 1. FIG. 14 illustrates a section view of a stage where up to the gas barrier film 520 is deposited in the manufacturing process of the image sensor 100 according to Example 1. The image sensor 100 may employ a glass substrate as the substrate 200. The substrate 200 is, however, not limited to a glass substrate. As the substrate 200, a resin substrate with heat resistance, a metal substrate having the surface coated with SiOx or SiNx (silicon nitride) may also be used. On the glass substrate 200, Al is deposited and formed, by patterning, as metal which is to be the gate of the TFT 400 and the gate wiring 410. Other than Al, for example, Cr, ITO, W or an alloy thereof may also be used. SiOx is deposited thereon as the gate insulating film 420. For the gate insulating film 420, SiNx or a layered film of SiOx and SiNx may also be used other than SiOx. Next, as the semiconductor layer 430, an oxide semiconductor layer containing In, Ga and Zn may be deposited and formed by patterning. Subsequently, Al is deposited and formed by patterning as the source/drain metal 440, 450. Other than Al, for example, Cr or an alloy thereof may also be used for the source/drain metal 440, 450. Though not illustrated, before the source/drain metal 440, 450 is deposited, an insulating film of SiOx or the like may be formed by patterning at a portion to be the channel of the TFT 400 in the oxide semiconductor layer. The structure in which the insulating film pattern is arranged in the channel part of the TFT 400 is called a channel protective TFT, while the structure not provided with the insulating film pattern as illustrated in FIG. 14 may be called a channel-etched TFT. The image sensor 100 according to Example 1 may employ either one of the structures. Next, SiOx is deposited as the first interlayer film 510 over the source/drain metal 440, 450. For the first interlayer film 510, SiOx, SiNx or a layered film of SiOx and SiNx may also be used. As the gas barrier film 520, p-xylene polymer is then deposited over the first interlayer film 510. For the gas barrier film 520, xylene polymer such as m-xylene polymer and its derivative, acrylic resin, epoxy resin or the like may be used. For the gas barrier film 520, an inorganic insulating film may also be used other than the organic insulating film. The inorganic insulating film is a film made of, for example, SiNx or $Al_2O_3$ (aluminum oxide). In this case also, the film thickness is preferably 1 μm or larger. It is however required to reduce hydrogen contained in the raw gas in depositing of SiNx. For example, plasma chemical vapor deposition (CVD) with $SiF_4$ and $N_2$ gas may be employed for deposition. According to the result of experiment by the inventors, SiOx which is an inorganic insulating film produced little effect of suppressing diffusion of hydrogen gas, and therefore is not suitable for a gas barrier film.

Figure 15:
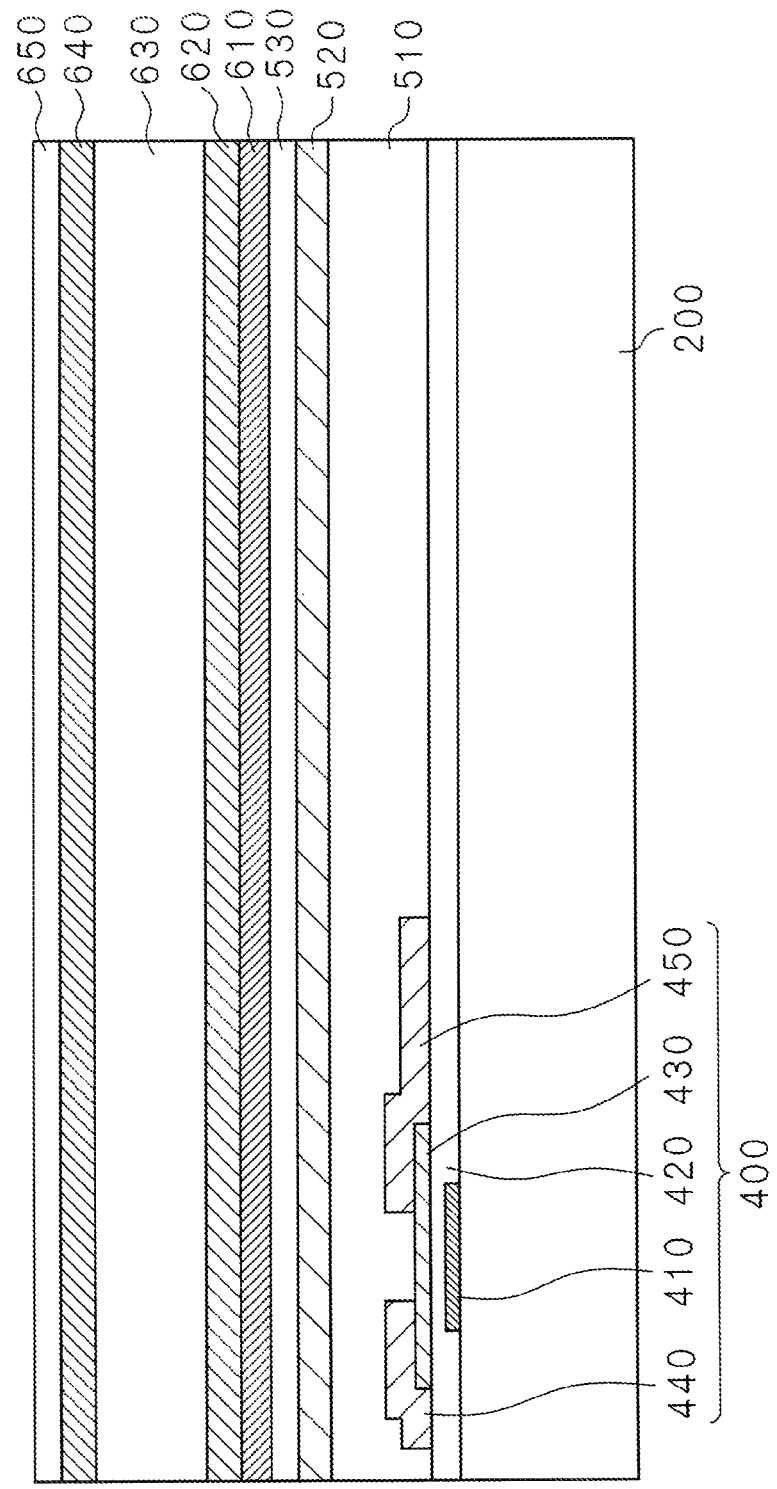
FIG. 15 is a section view illustrating the manufacturing process of the image sensor according to Example 1.

As illustrated in FIG. 15, SiOx is deposited as the second interlayer film 530 over the gas barrier film 520. The second interlayer film 530 is deposited for the purpose of increasing the adhesion between the gas barrier film 520 and the lower electrode 610 of PD. A suitable material is selected for the second interlayer film 530 in accordance with the type of the gas barrier film 520 and the metal of the lower electrode 610. Alternatively, deposition of the second interlayer film 530 may not always be necessary. On the second interlayer film 530, Cr is deposited as the lower electrode 610 of the PD 600. For the lower electrode 610, Al, ITO or the like may also be used other than Cr. On the lower electrode 610, the layers of n-a-Si:H 620, i-a-Si:H 630 and p-a-Si:H 640 are deposited. These three layers are preferably deposited in sequence by the plasma CVD. It is further preferable for the film thickness of i-a-Si:H to be approximately 1 μm in terms of the quantum efficiency. ITO is deposited thereon as upper electrode 650 of the PD. For the upper electrode 650, a transparent conductive film such as ZnO may also be used other than ITO.

Figure 16:
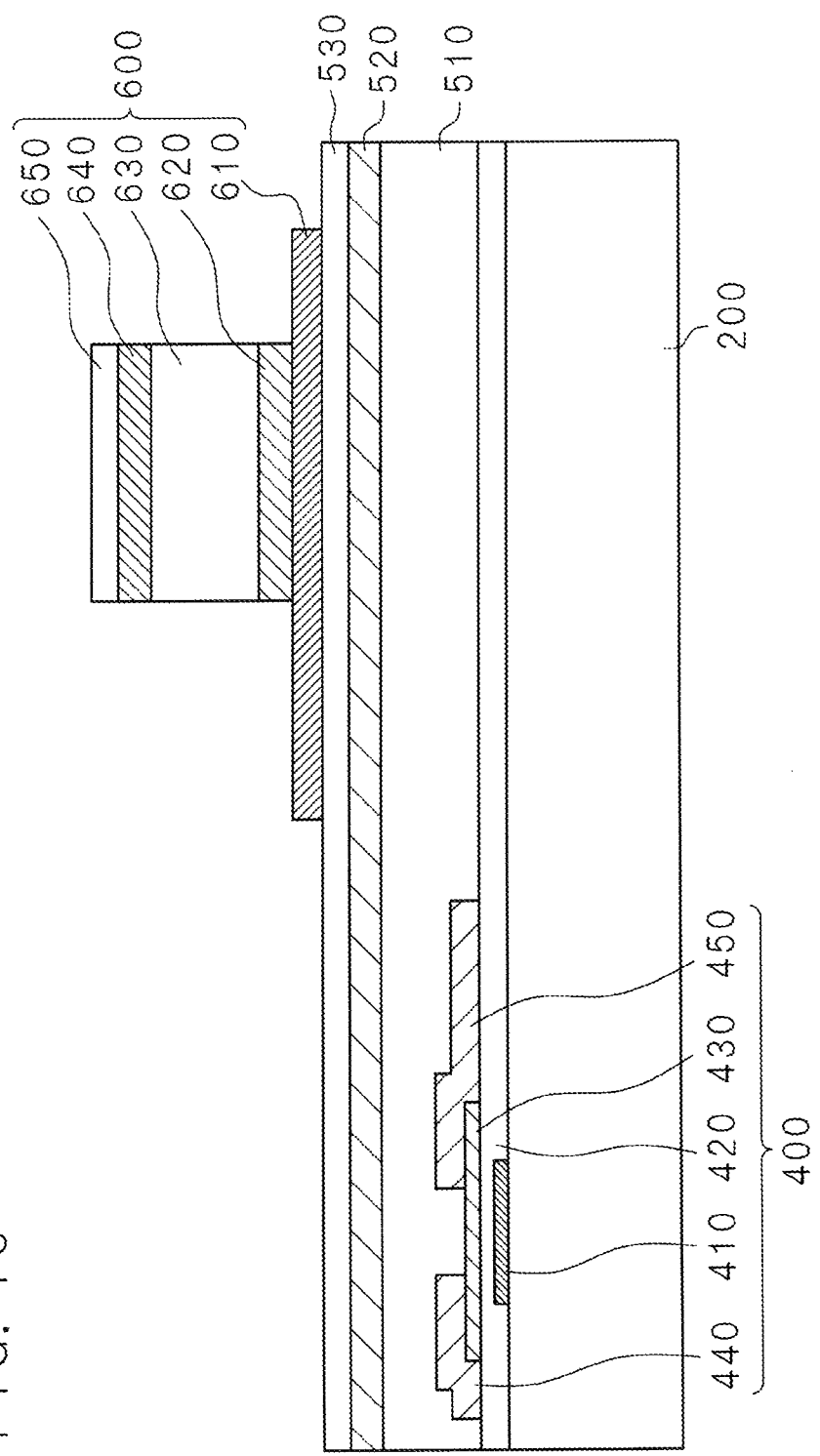
FIG. 16 is a section view illustrating the manufacturing process of the image sensor according to Example 1.

Next, as illustrated in FIG. 16, the PD 600 is formed by patterning. In this example, patterning is carried out so that the upper electrode 650, p-a-Si:H 640, i-a-Si:H 630 and n-a-Si:H 620 that constitute the PD 600 are formed in the same shape, and then the lower electrode 610 is formed also by patterning.

Figure 17:
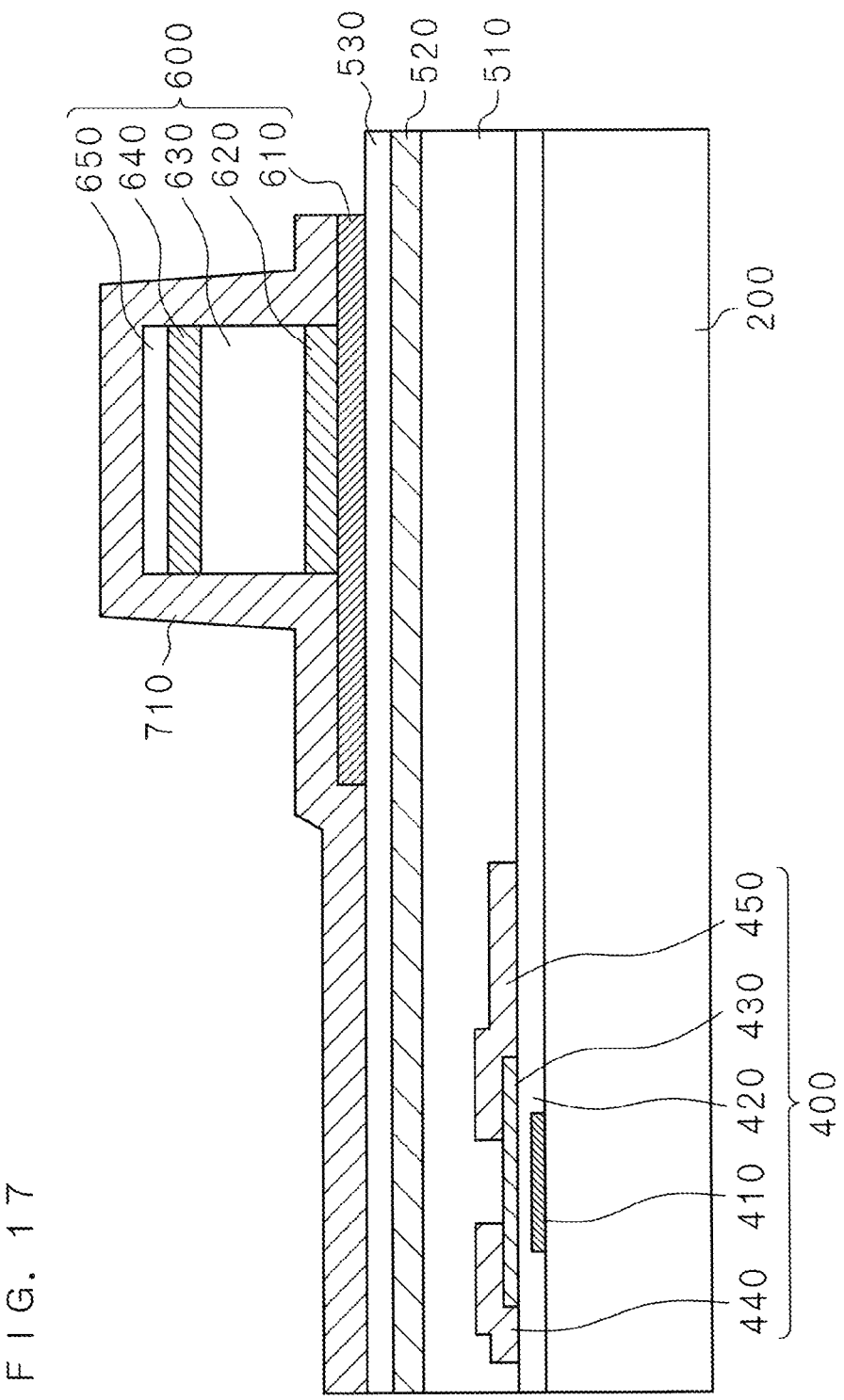
FIG. 17 is a section view illustrating the manufacturing process of the image sensor according to Example 1.

Subsequently, as illustrated in FIG. 17, SiNx is deposited as the protective film 710. For the protective film 710, other than SiNx, SiOx, acrylic resin or a layered film thereof may also be used.

Figure 18:
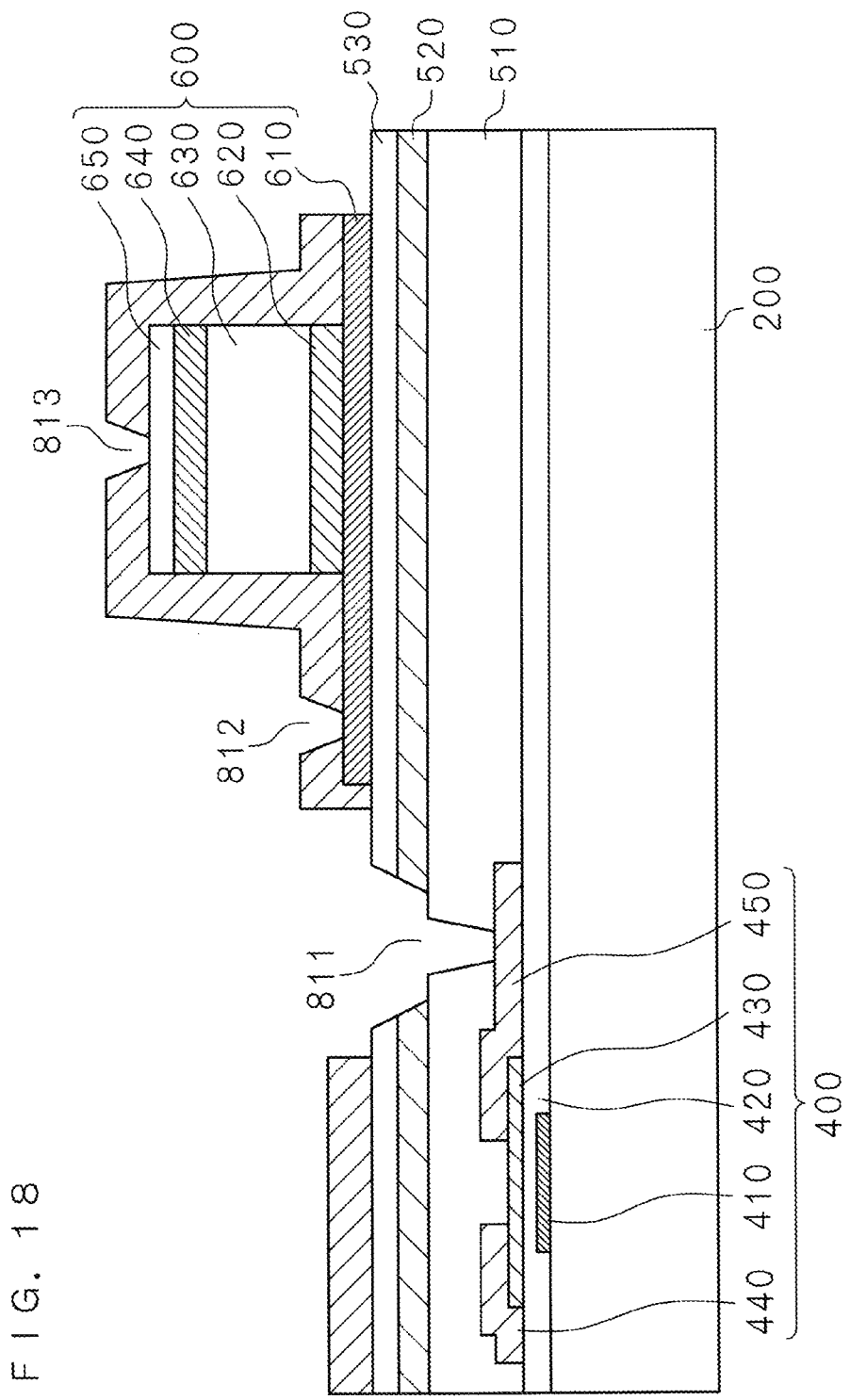
FIG. 18 is a section view illustrating the manufacturing process of the image sensor according to Example 1.

As illustrated in FIG. 18, contact holes 811, 812 and 813 are formed in the protective film 710, second interlayer film 530, gas barrier film 520 and first interlayer film 510. As it may be difficult to form contact holes in these films of the protective film, multiple interlayer films and gas barrier film with one photolithography step, contact holes of different dimensions may alternatively be formed by multiple photolithography steps.

Figure 19:
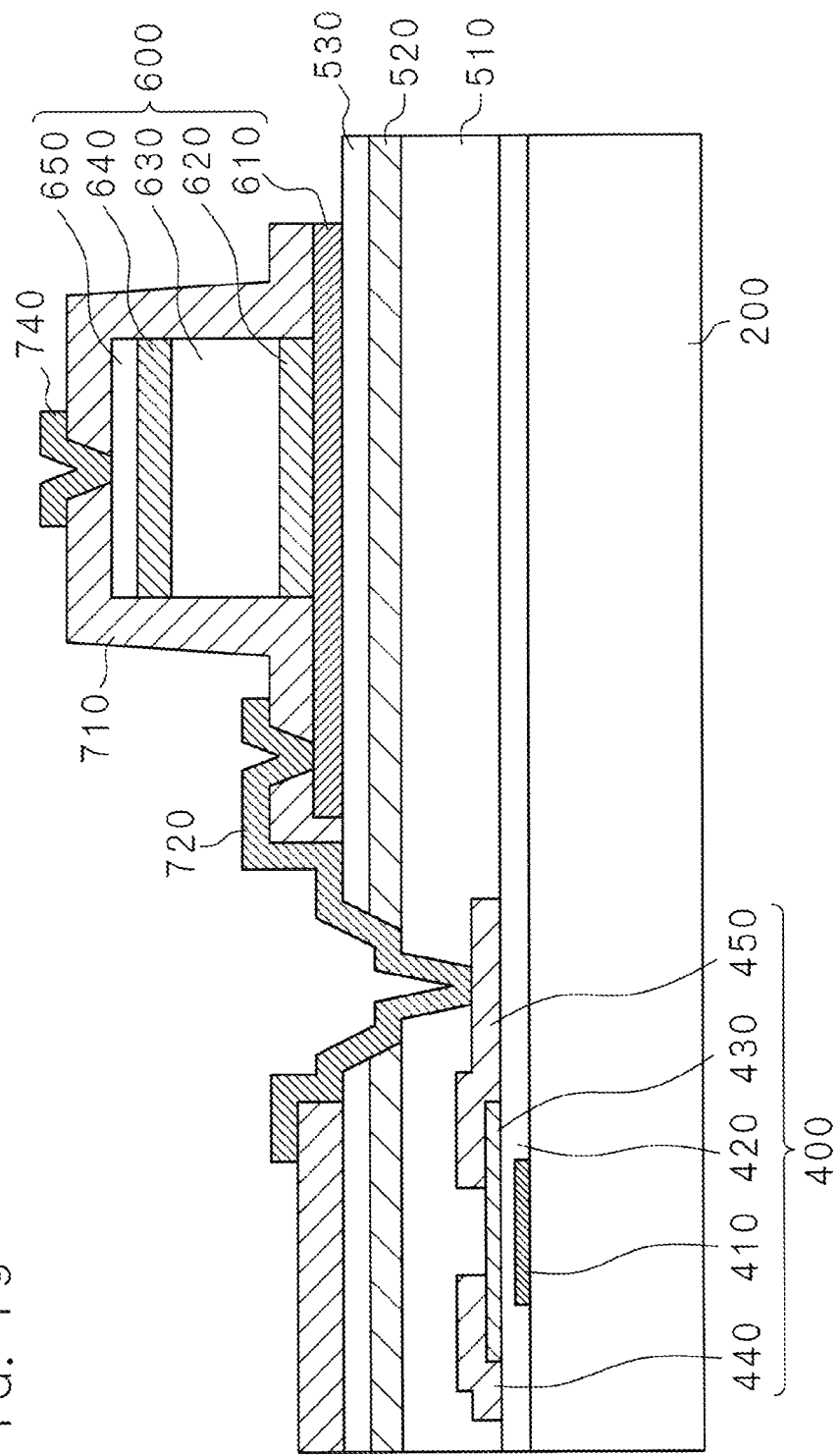
FIG. 19 is a section view illustrating the manufacturing process of the image sensor according to Example 1.

Subsequently, as illustrated in FIG. 19, a bridge wiring 720, a BIAS wiring 740 and, though not illustrated, Al as metal to be a signal line are deposited and formed by patterning. Other than Al, an Al alloy having small specific resistance may also be used. Moreover, in the image sensor according to Example 1, the metal forming the bridge wiring, BIAS wiring and signal line needs to be electrically connected to the source/drain metal, the metal forming the lower electrode 610 of the PD 600 and the metal forming the upper electrode 650 of the PD 600. Different materials may be used for the source/drain metal, the metal forming the lower electrode 610 of the PD 600, and the metal forming the upper electrode 650 of the PD 600. Thus, as illustrated in FIG. 20, for the purpose of electrical connection with multiple different types of metal, the metal forming the bridge wiring, BIAS wiring and signal line may be a layered film of two or more types of different metal layers. It is, however, preferable to use metal having small specific resistance such as Al or Al alloy for one of the metal layers to be deposited. This is because the time constant for the signal line and the BIAS wiring affects the signal reading speed of the PD 600.

As described earlier, it is not always necessary to form the second interlayer film 530 depending on the combination of the type of the gas barrier film 520 and the type of the lower electrode 610 of the PD 600. The cross-sectional structure without the second interlayer film 530 is as illustrated in FIG. 21. Since the image sensor 100 illustrated in FIG. 21 is not provided with the second interlayer film 530, the lower electrode 610 is located to be in contact with the gas barrier film 520.

In the image sensor 100 according to Example 1, no contact hole is formed in the gas barrier film 520 in deposition of a-Si:H containing a large amount of hydrogen as raw gas. It is therefore possible to suppress hydrogen gas being diffused to the semiconductor oxide layer uniformly across the entire substrate. As a result, variation in the characteristic of the oxide semiconductor TFT 400 may be suppressed, which allows the image sensor to operate at high speed.

While an example for manufacturing the image sensor 100 according to Embodiment 1 has been described above, the image sensor 100 according to Embodiment 2 may likewise be manufactured if metal such as Cr, Al, ITO or the like may be deposited and formed by patterning as the metal to be the second gate 460 before deposition of the gas barrier film 520.

Example 2

Figure 22:
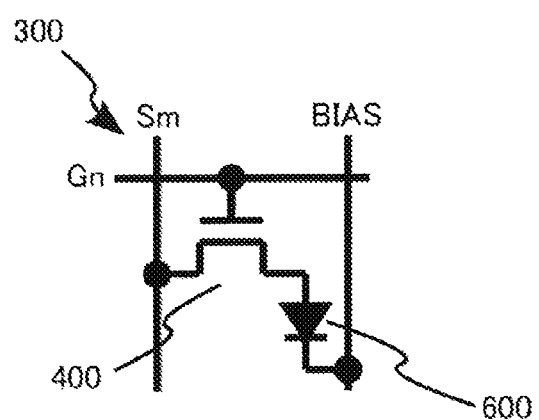
FIG. 22 is a circuit diagram illustrating the circuit configuration of one pixel in the image sensor according to Example 2.

FIG. 22 is a circuit diagram illustrating the circuit configuration of one pixel in the image sensor 100 according to Example 2. Each pixel is configured by a TFT 400 which is a switching element and a PD 600 which is a photoelectric conversion element as in Example 1, while the method of connecting the TFT 400 to the PD 600 is different. In the image sensor according to Example 2, the drain terminal of the TFT 400 is connected to the anode terminal of the PD 600.

Figure 23:
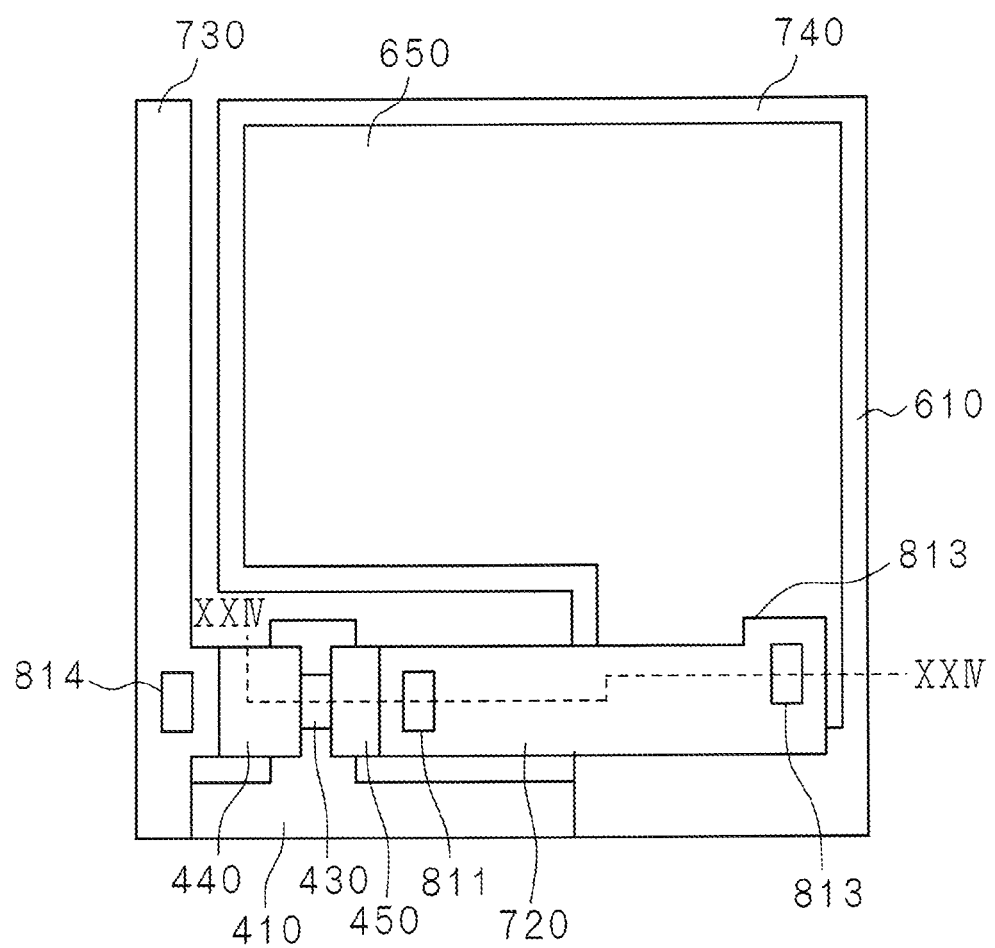
FIG. 23 is a layout of one pixel in the image sensor according to Example 2.

FIG. 23 is a layout of one pixel in the image sensor 100 according to Example 2. The drain metal 450 of the TFT 400 is connected to the bridge wiring 720 via a contact hole 811. Moreover, the bridge wiring 720 is connected to an upper electrode 650 of the PD 600 via a contact hole 813. In Example 2, as the upper electrode 650 serves as the anode terminal of the PD 600, the drain terminal of the TFT 400 is connected to the anode terminal of the PD 600. As described above, the PD 600 is an example of the photoelectric conversion element included in the image sensor 100. One terminal of the photoelectric conversion element is, for example, an upper electrode 650 according to Example 2.

Figure 24:
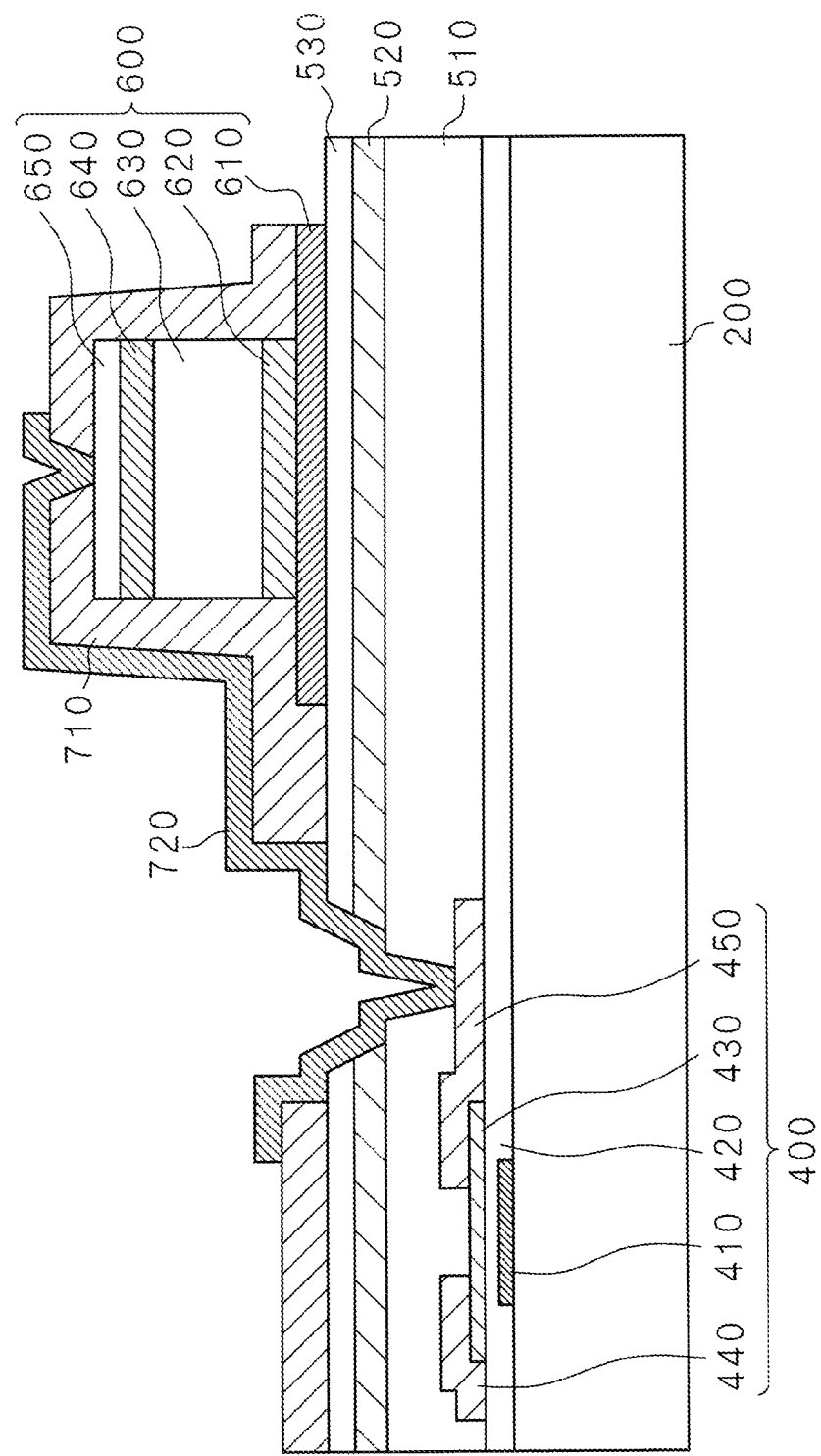
FIG. 24 is a section view illustrating the structure of an image sensor according to Example 2.
Figure 25:
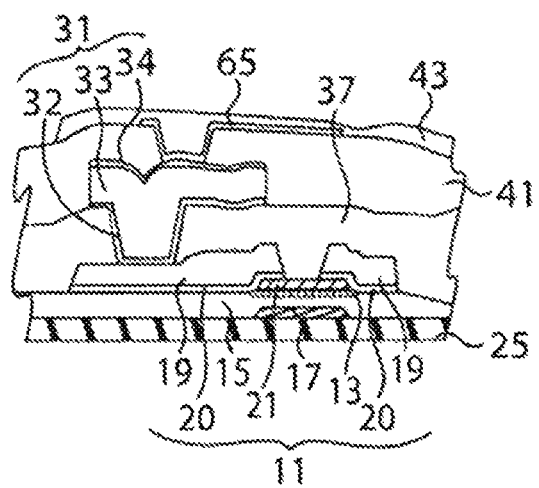
FIG. 25 is a section view illustrating the structure of an image sensor having an oxide semiconductor TFT in a related technology.

FIG. 24 is a section view (cross section along the XXIV-XXIV line in FIG. 23) illustrating the structure of an image sensor 100 according to Example 2. While the structure below the gas barrier film 520 (position closer to the substrate than the gas barrier film 520) is the same as that of the image sensor 100 according to Embodiment 1, the image sensor in Example 2 is different from the image sensor in Embodiment 1 in that the drain metal 450 of the TFT 400 is connected to the upper electrode 650 of the PD 600 via the bridge wiring 720 and in that the lower electrode 610 of the PD 600 forms the BIAS wiring. The layering order and the film thickness of n-a-Si:H 620, i-a-Si:H 630, p-a-Si:H 640 forming the PD 600 may be set to be the same as those in the image sensor 100 according to Embodiment 1.

Also in the image sensor 100 according to Example 2, it is not necessary to form a contact hole in the gas barrier film 520 at the time of forming the PD 600. It is therefore possible to suppress diffusion of hydrogen gas in formation of the PD 600 uniformly across the entire substrate, thereby suppressing variation in the characteristic of the oxide semiconductor TFT.

The technical features (components) described in each embodiment and example may be combined with one another, and such combinations may form new technical features.

It should be understood that the embodiments and examples disclosed herein are illustrative and non-restrictive in every respect. Since the scope of the present invention is defined by the appended claims rather than by the description preceding them, all changes that fall within metes and bounds of the claims, or equivalence of such metes and bounds thereof are therefore intended to be embraced by the claims.

What is claimed is:
1. An image sensor, comprising:
   a substrate;
   a gas barrier film;
   a protective film; and
   a plurality of pixels,
   wherein each one of the pixels includes a switching element including an oxide semiconductor TFT, a photoelectric conversion element including a photodiode having amorphous silicon, and a connection wiring configured to electrically connect the switching element and the photoelectric conversion element, the gas barrier film disposed above the switching elements on the substrate,
   the photoelectric conversion element disposed above the gas barrier film and including an upper electrode at an upper part in a layering direction and a lower electrode at a lower part in the layering direction,
   the protective film covering the photoelectric conversion element, and
   the connection wiring i) being made of a single material, ii) being arranged on the protective film covering the photoelectric conversion element, and iii) electrically connecting, via contact holes, the switching element and the photoelectric conversion element of a same pixel, said contact holes including a first contact hole penetrating the protective film and the gas barrier film, and a second contact hole penetrating the protective film, the connection wiring connected to the drain electrode of the switching element via the first contact hole, and connected to the lower electrode of the photoelectric conversion element via the second contact hole.

2. The image sensor according to claim 1, wherein an opening area of a through hole of the first contact hole in the protective film is equal to or larger than an opening area of a through hole of the first contact hole in the gas barrier film.

3. The image sensor according to claim 1, wherein an inner surface of the through hole of the first contact hole in the gas barrier film is in contact with a part of the connection wiring.

4. The image sensor according to claim 1, wherein the oxide semiconductor TFT includes two gate electrodes arranged separately from each other in a layering direction.

5. The image sensor according to claim 1, wherein the gas barrier film is an organic insulating film.

6. The image sensor according to claim 5, wherein the organic insulating film is made of xylene polymer or a derivative of the xylene polymer, acrylic resin or epoxy resin.

7. The image sensor according to claim 1, wherein the gas barrier film is an inorganic insulating film.

8. The image sensor according to claim 7, wherein the inorganic insulating film is a film of silicon nitride or aluminum oxide.

9. The image sensor according to claim 1, wherein the gas barrier film is an inorganic insulating film, and the lower electrode of the photoelectric conversion element is located to be in contact with the gas barrier film.

10. The image sensor according to claim 1, wherein a thickness of the gas barrier film is equal to or larger than 1 µm.

11. A method of manufacturing an image sensor, comprising the steps of:
layering, on a substrate, a switching element formed of an oxide semiconductor TFT, a gas barrier film and a photoelectric conversion element including a photo diode having amorphous silicon in order of the switching element, the gas barrier film and the photoelectric conversion element, the photoelectric conversion element including an upper electrode at an upper part in a layering direction and a lower electrode at a lower part in the layering direction;
forming a protective film covering the photoelectric conversion element and forming contact holes in the protective film and the gas barrier film; and
forming a connection wiring, formed of a single conductive layer, on the protective film and electrically connecting a drain electrode of the switching element and one terminal of the photoelectric conversion element via the contact holes,
the contact holes including a first contact hole penetrating the protective film and the gas barrier film, and a second contact hole penetrating the protective film, the connection wiring connected to the drain electrode of the switching element via the first contact hole, and connected to the lower electrode of the photoelectric conversion element via the second contact hole.

12. The image sensor according to claim 1, wherein the connection wiring connects a drain electrode of the switching element and one terminal of the photoelectric conversion element in the same pixel, the oxide semiconductor TFT configured to switch a current from the terminal of the photoelectric conversion element.

* * * * *